US012795924B2

(12) United States Patent
Kim et al.

(10) Patent No.: US 12,795,924 B2
(45) Date of Patent: Nov. 10, 2026

(54) SEMICONDUCTOR DEVICES WITH IMPROVED RETENTION PROPERTY AND ELECTRONIC SYSTEMS INCLUDING THE SAME

(71) Applicant: Samsung Electronics Co., Ltd., Suwon-si (KR)

(72) Inventors: Byongju Kim, Suwon-si (KR); Dongsung Choi, Suwon-si (KR); Wonjun Park, Suwon-si (KR); Donghwa Lee, Suwon-si (KR); Jaemin Jung, Suwon-si (KR); Changheon Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 409 days.

(21) Appl. No.: 18/331,397

(22) Filed: Jun. 8, 2023

(65) Prior Publication Data

US 2024/0147722 A1 May 2, 2024

(30) Foreign Application Priority Data

Nov. 2, 2022 (KR) ........................ 10-2022-0144738

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 9,166,032 B1 * 10/2015 Higuchi ................. H10B 43/27
10,181,475 B2 1/2019 Jhang et al.
(Continued)

FOREIGN PATENT DOCUMENTS

KR 10-2022-0118258 A 8/2022

OTHER PUBLICATIONS

"Thermal nitridation of Si and SiO2for VLSIJ M.M. Moslehi Et al., IEEE Transactions on Electron Devices ( vol. 32, Issue: 2, Feb. 1985)".

*Primary Examiner* — William B Partridge
*Assistant Examiner* — Gustavo G Ramallo
(74) *Attorney, Agent, or Firm* — Wolf, Greenfield & Sacks, P.C.

(57) ABSTRACT

A semiconductor device may include a gate stack that includes a first insulating pattern, a second insulating pattern adjacent to the first insulating pattern, a third insulating pattern adjacent to the second insulating pattern, a first conductive pattern between the first and second insulating patterns, and a second conductive pattern between the second and third insulating patterns, a channel layer that extends in the gate stack, a tunnel insulating layer on the channel layer, and a first data storage pattern and a second data storage pattern on the tunnel insulating layer. The first data storage pattern may include a first outer portion between the first and second insulating patterns, and a first inner portion on the first outer portion.

20 Claims, 21 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10B 80/00*** | (2023.01) |
| ***H10W 20/41*** | (2026.01) |
| ***H10W 90/00*** | (2026.01) |
| *H10W 72/00* | (2026.01) |

(52) U.S. Cl.
CPC ............. *H10B 43/10* (2023.02); *H10B 43/35* (2023.02); *H10B 80/00* (2023.02); *H10W 20/435* (2026.01); *H10W 90/00* (2026.01); *H10W 72/834* (2026.01)

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 10,903,232 | B2 | 1/2021 | Tsutsumi | |
| 10,998,331 | B2 | 5/2021 | Zhou et al. | |
| 11,063,063 | B2 | 7/2021 | Zhang et al. | |
| 2013/0016561 | A1* | 1/2013 | Nam | H10B 43/35 365/185.11 |
| 2013/0069139 | A1* | 3/2013 | Ishihara | H10B 43/27 257/E21.41 |
| 2015/0041882 | A1* | 2/2015 | Lee | H10D 30/693 257/324 |
| 2016/0293623 | A1* | 10/2016 | Simsek-Ege | H10D 64/037 |
| 2018/0040623 | A1 | 2/2018 | Kanakamedala et al. | |
| 2019/0252405 | A1* | 8/2019 | Tsutsumi | G11C 16/0466 |
| 2021/0074719 | A1 | 3/2021 | Lee et al. | |
| 2021/0074720 | A1 | 3/2021 | Son et al. | |
| 2021/0296458 | A1 | 9/2021 | Okada et al. | |
| 2022/0084953 | A1 | 3/2022 | Noguchi et al. | |

* cited by examiner

SEMICONDUCTOR DEVICES WITH IMPROVED RETENTION PROPERTY AND ELECTRONIC SYSTEMS INCLUDING THE SAME

CROSS-REFERENCE TO RELATED APPLICATIONS

This U.S. non-provisional patent application claims priority under 35 U.S.C. § 119 to Korean Patent Application No. 10-2022-0144738, filed on Nov. 2, 2022, in the Korean Intellectual Property Office, the entire contents of which are hereby incorporated by reference.

BACKGROUND

The present disclosure relates to semiconductor devices and electronic systems including the same, and in particular, to semiconductor devices including a data storage pattern and electronic systems including the same.

Due to their small-sized, multifunctional, and/or low-cost characteristics, semiconductor devices are being regarded as important elements in the electronics industry. The semiconductor devices may be classified into a semiconductor memory device for storing data, a semiconductor logic device for processing data, and a hybrid semiconductor device including both memory and logic elements.

With the recent trend of high speed and low power consumption of electronic devices, semiconductor devices in the electronic devices are also required to have high operating speeds and/or low operating voltages, and in order to satisfy this requirement, it is necessary to increase an integration density of the semiconductor device. However, as the integration density of the semiconductor device increases, the semiconductor device may suffer from deterioration in electrical characteristics and production yield. Accordingly, many studies are being conducted to improve the electrical characteristics and production yield of the semiconductor device.

SUMMARY

Example embodiments of the inventive concept provide semiconductor devices with improved electrical and reliability characteristics and electronic systems including the same.

According to some embodiments of the inventive concept, a semiconductor device may include a gate stack that includes a first insulating pattern, a second insulating pattern adjacent to the first insulating pattern, a third insulating pattern adjacent to the second insulating pattern, a first conductive pattern between the first and second insulating patterns, and a second conductive pattern between the second and third insulating patterns, a channel layer that extends in the gate stack, a tunnel insulating layer on the channel layer, and a first data storage pattern and a second data storage pattern on the tunnel insulating layer. The first data storage pattern may include a first outer portion between the first and second insulating patterns, and a first inner portion on the first outer portion. The second data storage pattern may include a second outer portion between the second and third insulating patterns, and a second inner portion on the second outer portion. A distance between each of the first and second inner portions and the channel layer may be smaller than a distance between each of the first to third insulating patterns and the channel layer.

According to some embodiments of the inventive concept, a semiconductor device may include a gate stack that includes an insulating pattern and a conductive pattern alternately stacked on top of each other, a channel layer that extends in the gate stack, a tunnel insulating layer on the channel layer, a data storage pattern on the tunnel insulating layer, and a blocking pattern on the data storage pattern. The data storage pattern may include a first surface in contact with the blocking pattern and a second surface in contact with the insulating pattern. The first surface of the data storage pattern may have a curved shape, and the second surface of the data storage pattern may have a flat shape.

According to some embodiments of the inventive concept, an electronic system may include a main substrate, a semiconductor device on the main substrate, and a controller on the main substrate and electrically connected to the semiconductor device. The semiconductor device may include a gate stack that includes an insulating pattern and a conductive pattern alternately stacked on top of each other, a channel layer that extends in the gate stack, a tunnel insulating layer on the channel layer, data storage patterns on the tunnel insulating layer, and blocking patterns on the data storage patterns, respectively. The data storage patterns may be spaced apart from each other, and each of the data storage patterns may include an outer portion in contact with a top surface of the insulating pattern, and an inner portion on the outer portion. A distance between the inner portion and the channel layer may be smaller than a distance between the insulating pattern and the channel layer, and the inner portion and the outer portion may include a nitride material.

DETAILED DESCRIPTION

Example embodiments of the inventive concepts will now be described more fully with reference to the accompanying drawings, in which example embodiments are shown.

Figure 1A:
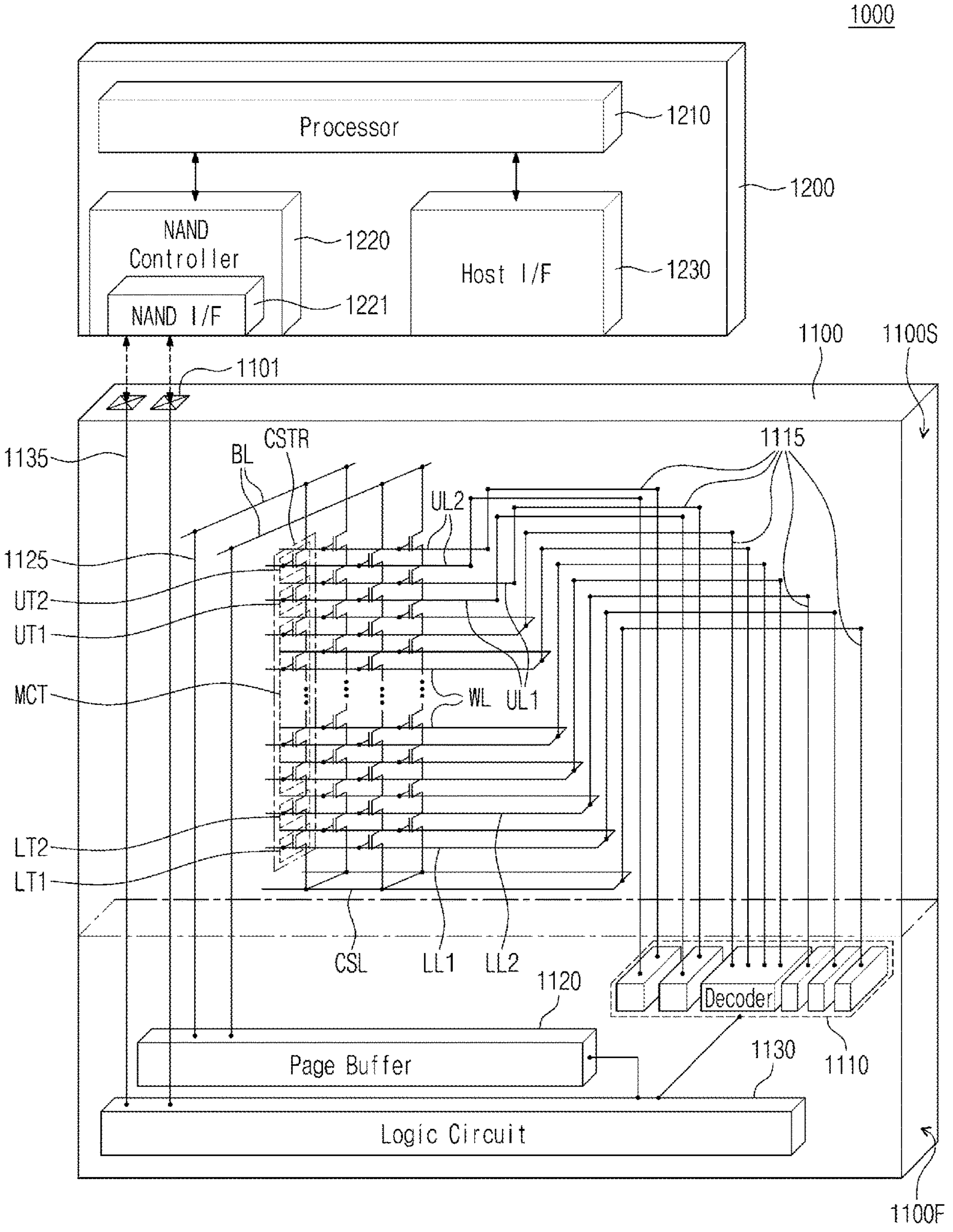
FIG. 1A is a schematic diagram illustrating an electronic system including a semiconductor device according to some embodiments of the inventive concept.

FIG. 1A is a schematic diagram illustrating an electronic system including a semiconductor device according to some embodiments of the inventive concept.

Referring to FIG. 1A, an electronic system 1000 according to some embodiments of the inventive concept may include a semiconductor device 1100 and a controller 1200, which is electrically connected to the semiconductor device 1100. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device and may be, for example, a NAND FLASH memory device. The semiconductor device 1100 may include a first structure 1100F and a second structure 1100S on the first structure 1100F. In some embodiments, the first structure 1100F may be disposed beside the second structure 1100S. The first structure 1100F may be a peripheral circuit structure, which includes a decoder circuit 1110, a page buffer 1120, and a logic circuit 1130. The second structure 1100S may be a memory cell structure, which includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2, which are adjacent to the common source line CSL, upper transistors UT1 and UT2, which are adjacent to the bit line BL, and a plurality of memory cell transistors MCT, which are disposed between the lower transistors LT1 and LT2 and the upper transistors UT1 and UT2. The number of the lower transistors LT1 and LT2 and the number of the upper transistors UT1 and UT2 may be variously changed, according to embodiments.

In some embodiments, the upper transistors UT1 and UT2 may include a string selection transistor, and the lower transistors LT1 and LT2 may include a ground selection transistor. The gate lower lines LL1 and LL2 may be respectively used as gate electrodes of the lower transistors LT1 and LT2. The word lines WL may be used as gate electrodes of the memory cell transistors MCT, respectively, and the gate upper lines UL1 and UL2 may be used as gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F into the second structure 1100S. The bit lines BL may be electrically connected to the page buffer 1120 through second connection lines 1125, which extend from the first structure 1100F into the second structure 1100S.

In the first structure 1100F, the decoder circuit 1110 and the page buffer 1120 may be configured to perform a control operation on at least a selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which extends from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may be configured to control the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit and receive control commands to control the semiconductor device 1100, transmit and receive data to be written in or read from the memory cell transistors MCT of the semiconductor device 1100, and so forth. The host interface 1230 may be configured to allow for communication between the electronic system 1000 and an external host. When a control command is received from the external host through the host interface 1230, the processor 1210 may control the semiconductor device 1100 in response to the control command.

Figure 1B:
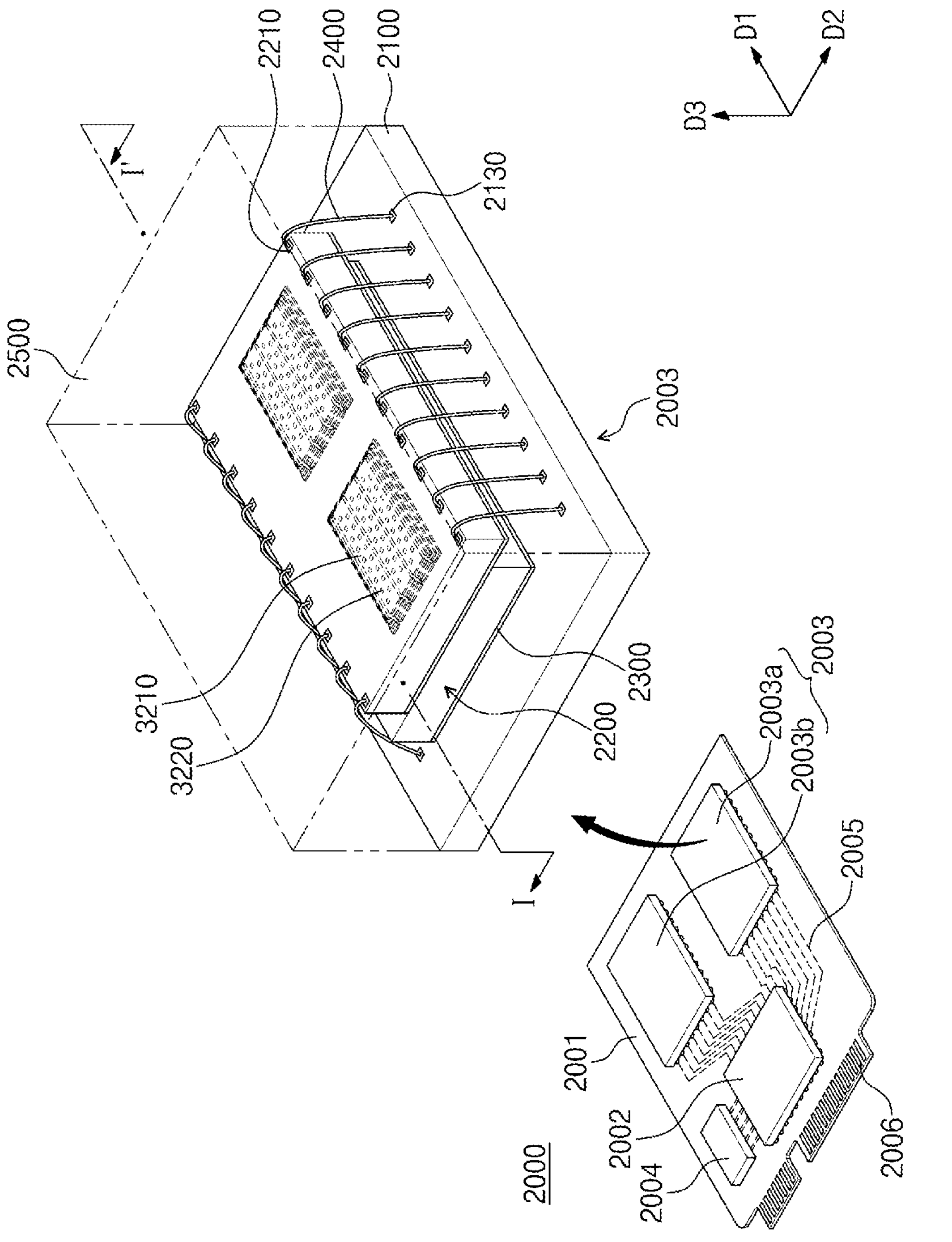
FIG. 1B is a perspective view schematically illustrating an electronic system including a semiconductor device according to some embodiments of the inventive concept.

FIG. 1B is a perspective view schematically illustrating an electronic system including a semiconductor device, according to some embodiments of the inventive concept.

Referring to FIG. 1B, an electronic system 2000 according to some embodiments of the inventive concept may include a main substrate 2001 and a controller 2002, one or more semiconductor packages 2003, and a DRAM 2004, which are mounted on the main substrate 2001. The semiconductor package 2003 and the DRAM 2004 may be connected to the controller 2002 and to each other by interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In some embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In some embodiments, the electronic system 2000 may be driven by an electric power, which is supplied from the external host through the connector 2006. The electronic system 2000 may further include a power management integrated circuit (PMIC) that is configured to distribute a power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In some embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200, which are provided on the package substrate 2100, adhesive layers 2300, which are respectively disposed in bottom surfaces of the semiconductor chips 2200, a connection structure 2400, which electrically connects the semiconductor chips 2200 to the package substrate 2100, and a molding layer 2500, which is provided on the package substrate 2100 to cover the semiconductor chips 2200 and the connection structure 2400.

The package substrate 2100 may be a printed circuit board, which includes package upper pads 2130. Each of the semiconductor chips 2200 may include an input/output pad 2210. The input/output pad 2210 may correspond to the input/output pad 1101 of FIG. 1A. Each of the semiconductor chips 2200 may include gate stacks 3210 and memory channel structures 3220. Each of the semiconductor chips 2200 may include a semiconductor device.

In some embodiments, the connection structure 2400 may be a bonding wire electrically connecting the input/output pad 2210 to the package upper pads 2130. Thus, in each of the first and second semiconductor packages 2003*a* and 2003*b*, the semiconductor chips 2200 may be electrically connected to each other in a bonding wire manner and may be electrically connected to the package upper pads 2130 of the package substrate 2100. Alternatively, in each of the first and second semiconductor packages 2003*a* and 2003*b*, the semiconductor chips 2200 may be electrically connected to each other by a connection structure including through-silicon vias (TSVs), not by the connection structure 2400 provided in the form of bonding wires.

In some embodiments, the controller 2002 and the semiconductor chips 2200 may be included in a single package. In some embodiments, the controller 2002 and the semiconductor chips 2200 may be mounted on an additional interposer substrate different from the main substrate 2001 and may be connected to each other through interconnection lines, which are provided in the interposer substrate.

Figure 1C:
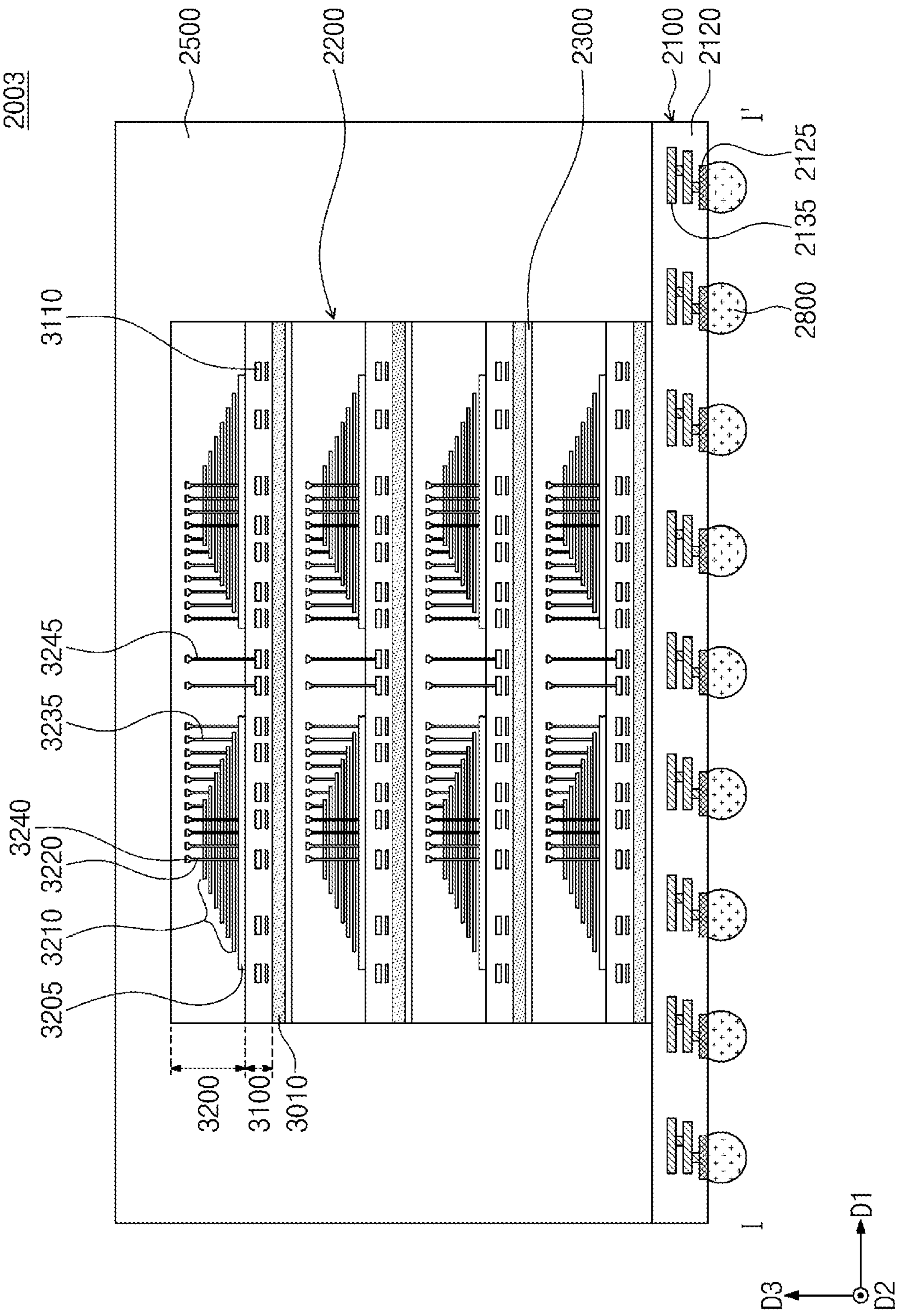
FIGS. 1C and 1D are sectional views schematically illustrating semiconductor packages according to some embodiments of the inventive concept.
Figure 1D:
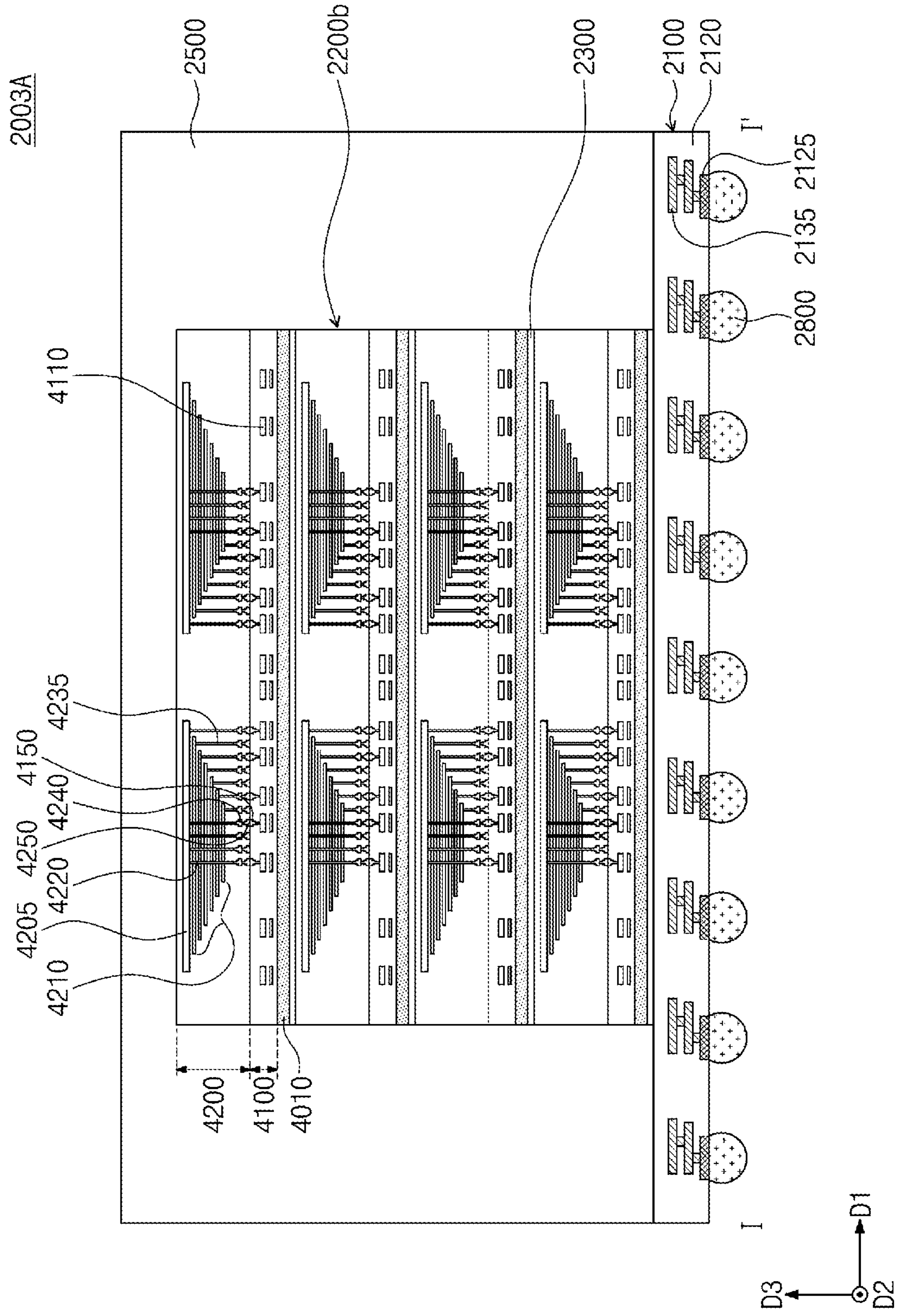

FIGS. 1C and 1D are sectional views schematically illustrating semiconductor packages according to some embodiments of the inventive concept. Each of FIGS. 1C and 1D schematically illustrates an example of the semiconductor package 2003 of FIG. 1B taken along a line I-I' of FIG. 1B.

Referring to FIG. 1C, in the semiconductor package 2003, the package substrate 2100 may be a printed circuit board. The package substrate 2100 may include a package substrate body portion 2120, package upper pads 2130 (e.g., of FIG. 1B) disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400 (e.g., of FIG. 1B). The lower pads 2125 may be connected to the interconnection patterns 2005 of the main substrate 2001 of the electronic system 2000, which is shown in FIG. 1B, through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region provided with peripheral lines 3110. The second structure 3200 may include a common source line 3205, a gate stack 3210 on the common source line 3205, the memory channel structures 3220, which are provided to penetrate or extend in the gate stack 3210, bit lines 3240, which are electrically connected to the memory channel structures 3220, and gate contact plugs 3235, which are electrically connected to the word lines WL (e.g., see FIG. 1A) of the gate stack 3210.

Each of the semiconductor chips 2200 may be electrically connected to the peripheral lines 3110 of the first structure 3100 and may include a penetration line 3245, which extends into the second structure 3200. The penetration line 3245 may be disposed outside the gate stack 3210. In some embodiments, the penetration line 3245 may be provided to penetrate or extend in the gate stack 3210. Each of the semiconductor chips 2200 may further include the input/output pad 2210 of FIG. 1B.

Referring to FIG. 1D, in a semiconductor package 2003A, each of semiconductor chips 2200*b* may include a semiconductor substrate 4010, a first structure 4100 on the semiconductor substrate 4010, and a second structure 4200, which is disposed on the first structure 4100 and is bonded to the first structure 4100 by a wafer bonding method.

The first structure 4100 may include a peripheral circuit region, in which a peripheral line 4110 and first junction structures 4150 are provided. The second structure 4200 may include a common source line 4205, a gate stack 4210 between the common source line 4205 and the first structure 4100, memory channel structures 4220, which are provided to penetrate or extend in the gate stack 4210, bit lines 4240 electrically connected to the memory channel structures 4220, gate contact plugs 4235, which are electrically connected to the word lines WL of FIG. 1A of the gate stack 4210, respectively, and second junction structures 4250. For example, the second junction structures 4250 may be electrically connected to the memory channel structures 4220, respectively, through the bit lines 4240, which are electrically connected to the memory channel structures 4220. The first junction structures 4150 of the first structure 4100 and the second junction structures 4250 of the second structure 4200 may be bonded to each other. In some embodiments, the bonding portion of the first and second junction structures 4150 and 4250 may be formed of copper (Cu). Each of the semiconductor chips 2200*b* may further include the input/output pad 2210 of FIG. 1B.

The semiconductor chips 2200 of FIG. 1C and the semiconductor chips 2200*b* of FIG. 1D may be electrically connected to each other by the connection structures 2400 of FIG. 1B, which are provided in the form of bonding wires. However, in some embodiments, semiconductor chips, which are provided in the same semiconductor package as the semiconductor chips 2200 of FIG. 1C or the semiconductor chips 2200*b* of FIG. 1D, may be electrically connected to each other through a connection structure including the through-silicon vias (TSVs).

Figure 2A:
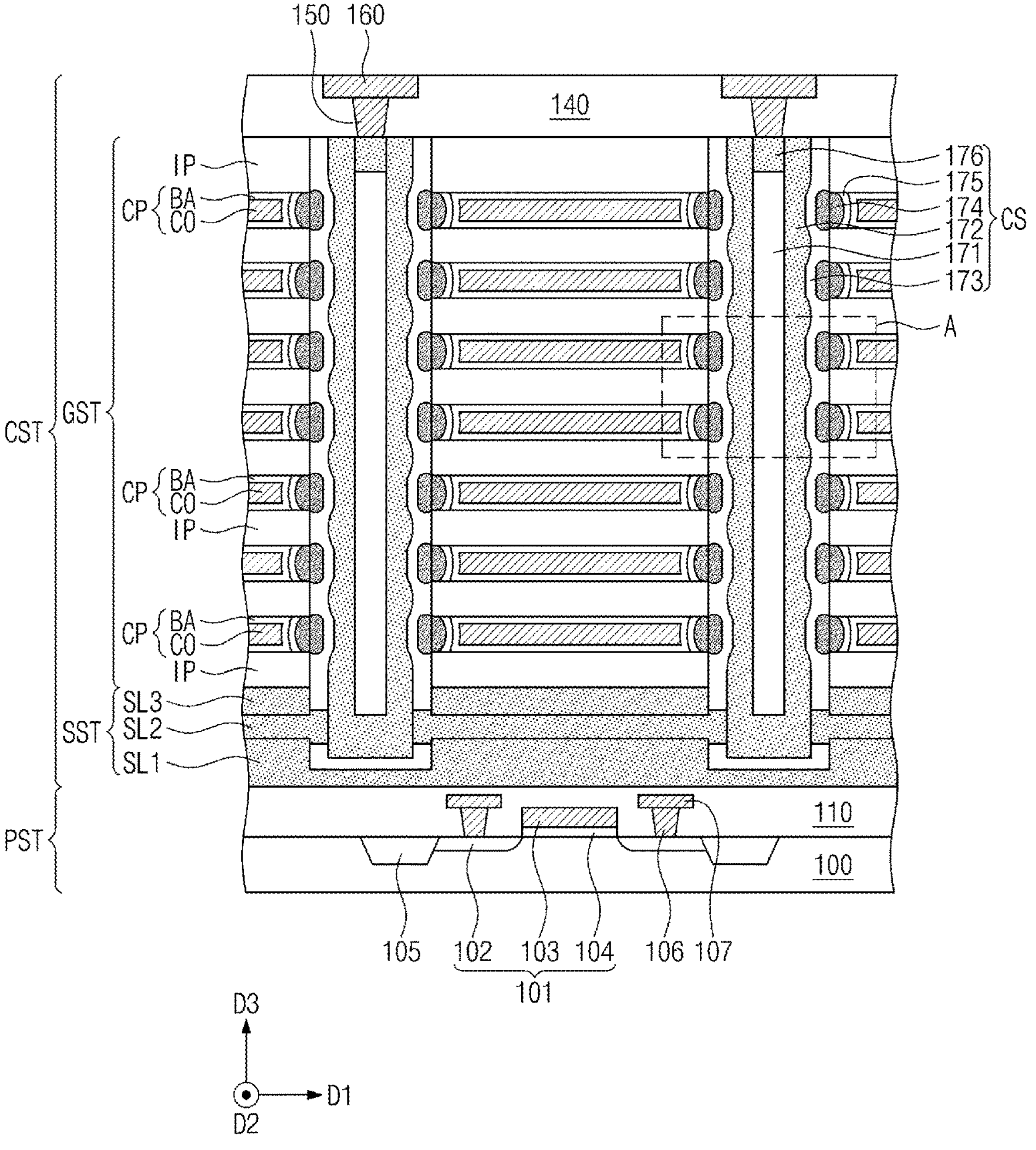
FIG. 2A is a sectional view illustrating a semiconductor device according to some embodiments of the inventive concept.
Figure 2B:
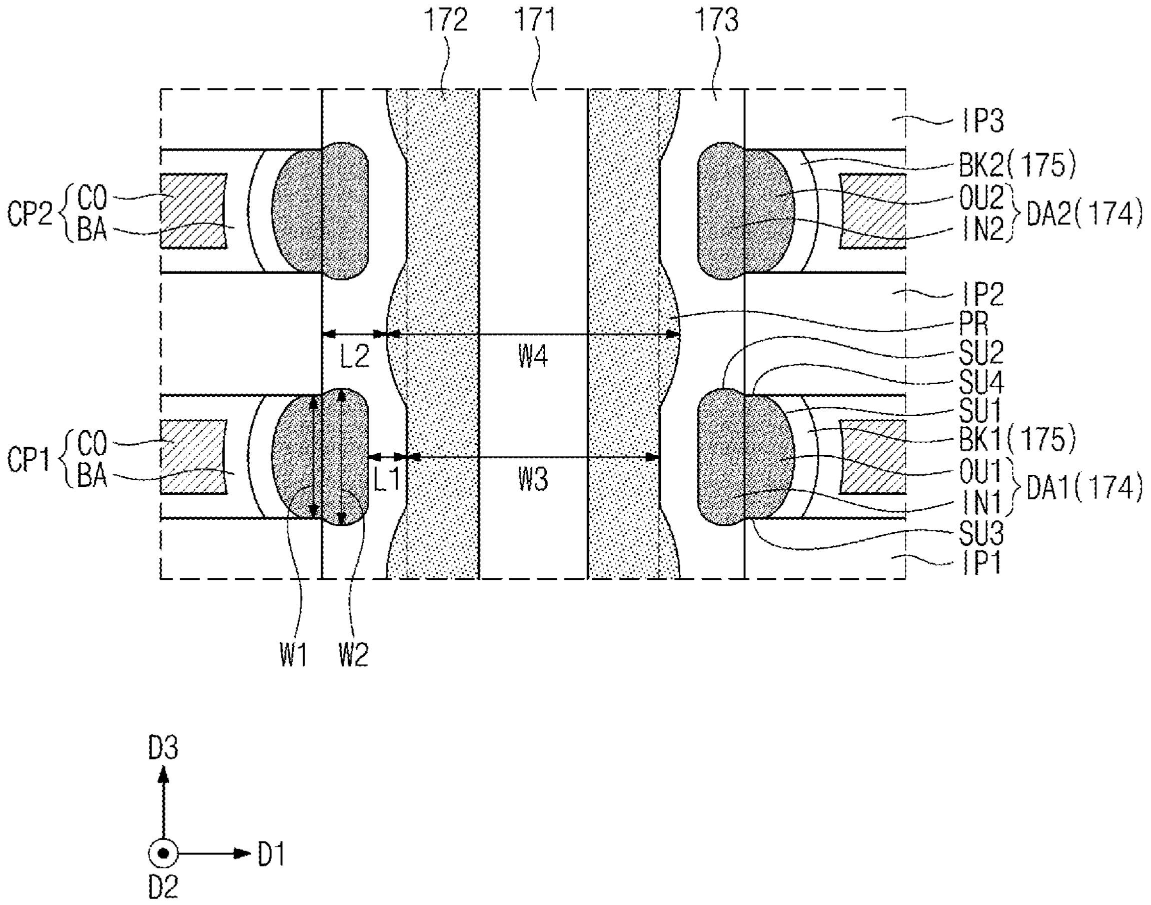
FIG. 2B is an enlarged sectional view illustrating a portion 'A' of FIG. 2A.

FIG. 2A is a sectional view illustrating a semiconductor device according to some embodiments of the inventive concept. FIG. 2B is an enlarged sectional view illustrating a portion 'A' of FIG. 2A.

Referring to FIGS. 2A and 2B, a semiconductor device may include a peripheral circuit structure PST and a memory cell structure CST on the peripheral circuit structure PST.

The peripheral circuit structure PST may include a substrate 100. The substrate 100 may be a plate-shaped structure that extends parallel to a plane defined by a first direction D1 and a second direction D2. The first and second directions D1 and D2 may not be parallel to each other. In some embodiments, the first and second directions D1 and D2 may be two different horizontal directions, which are orthogonal to each other. In some embodiments, the substrate 100 may be a semiconductor substrate. As an example, the substrate 100 may be formed of or include silicon, germanium, silicon-germanium, GaP, or GaAs. In some embodiments, the substrate 100 may be a silicon-on-insulator (SOI) substrate or a germanium-on-insulator (GOI) substrate.

The peripheral circuit structure PST may include a peripheral circuit insulating layer 110 on the substrate 100. The peripheral circuit insulating layer 110 may be formed of or include at least one of insulating materials. As an example, the peripheral circuit insulating layer 110 may be formed of or include an oxide material. In some embodiments, the peripheral circuit insulating layer 110 may be composed of a plurality of insulating layers.

The peripheral circuit structure PST may further include a peripheral transistor 101. The peripheral transistor 101 may be provided between the substrate 100 and the peripheral circuit insulating layer 110. In some embodiments, the peripheral transistor 101 may include source/drain regions 102, a gate electrode 103, and a gate insulating layer 104. Device isolation layers 105 may be provided in the substrate 100. The peripheral transistor 101 may be disposed between the device isolation layers 105. The device isolation layer 105 may be formed of or include an insulating material.

The peripheral circuit structure PST may further include peripheral contacts 106 and peripheral conductive lines 107. The peripheral contact 106 may be connected to the peripheral transistor 101 or the peripheral conductive line 107, and the peripheral conductive line 107 may be connected to the peripheral contact 106. The peripheral contact 106 and the peripheral conductive line 107 may be provided in the peripheral circuit insulating layer 110. The peripheral contact 106 and the peripheral conductive line 107 may be formed of or include a conductive material.

The memory cell structure CST may include a source structure SST, a gate stack GST, memory channel structures CS, a cover insulating layer 140, bit line contacts 150, and bit lines 160.

The source structure SST may include a first source layer SL1 on the peripheral circuit structure PST, a second source layer SL2 on the first source layer SL1, and a third source layer SL3 on the second source layer SL2.

The first to third source layers SL1, SL2, and SL3 may include a conductive material. As an example, the first to third source layers SL1, SL2, and SL3 may be formed of or include polysilicon. The second source layer SL2 may be a common source line.

The gate stack GST may be provided on the source structure SST. The gate stack GST may include insulating patterns IP and conductive patterns CP, which are alternately stacked in a third direction D3. The third direction D3 may not be parallel to the first and second directions D1 and D2. As an example, the third direction D3 may be a vertical direction that is orthogonal to the first and second directions D1 and D2.

The insulating patterns IP may include an insulating material. As an example, the insulating patterns IP may be formed of or include an oxide material. The conductive patterns CP may include a conductive layer CO and a barrier layer BA enclosing the conductive layer CO. The conductive layer CO may include a conductive material. As an example, the conductive layer CO may be formed of or include tungsten. The barrier layer BA may include a metal oxide or a metal nitride. For example, the barrier layer BA may be formed of or include aluminum oxide. The number of the insulating and conductive patterns IP and CP may not be limited to that in the illustrated example.

The memory channel structures CS may extend in the third direction D3 to penetrate or extend in the insulating and conductive patterns IP and CP of the gate stack GST and the third and second source layers SL3 and SL2 of the source structure SST.

The memory channel structure CS may include a capping layer 171, a channel layer 172 enclosing or on the capping layer 171, a tunnel insulating layer 173 enclosing or on the channel layer 172, data storage patterns 174 enclosing or on the tunnel insulating layer 173, and blocking patterns 175 enclosing or on the data storage patterns 174.

The capping layer 171 may include an insulating material. As an example, the capping layer 171 may be formed of or include an oxide material. The channel layer 172 may include a conductive material. As an example, the channel layer 172 may be formed of or include polysilicon. The channel layer 172 may be electrically connected to the second source layer SL2. The second source layer SL2 may be provided to penetrate or extend in the tunnel insulating layer 173 and may be connected to the channel layer 172. The tunnel insulating layer 173 may include an insulating material. As an example, the tunnel insulating layer 173 may be formed of or include an oxide material. The channel layer 172 and the tunnel insulating layer 173 may extend in the third direction D3 to penetrate or extend in the insulating and conductive patterns IP and CP of the gate stack GST.

The data storage patterns 174, which are included in one memory channel structure CS, may be spaced apart from each other in the third direction D3. The data storage patterns 174 in one memory channel structure CS may be arranged in the third direction D3. The data storage pattern 174 may be disposed at the same level in the third direction D3 as the conductive pattern CP. The data storage pattern 174 may be provided to have a ring shape. The data storage pattern 174 may include a material, which can be used to store data. In some embodiments, the data storage pattern 174 may be formed of or include silicon nitride.

The blocking patterns 175, which are included in one memory channel structure CS, may be spaced apart from each other in the third direction D3. The blocking patterns 175 in one memory channel structure CS may be arranged in the third direction D3. The blocking pattern 175 may be disposed at the same level in the third direction D3 as the conductive pattern CP and the data storage pattern 174. The blocking pattern 175 may be provided to have a ring shape. The blocking pattern 175 may include an insulating material. As an example, the blocking pattern 175 may be formed of or include an oxide material.

The memory channel structures CS may further include a bit line pad 176, which is provided on the channel layer 172. The bit line pad 176 may include a conductive material. As an example, the bit line pad 176 may be formed of or include at least one of polysilicon or metallic materials.

The cover insulating layer 140 may be provided on the gate stack GST and the memory channel structures CS. The cover insulating layer 140 may include an insulating material. As an example, the cover insulating layer 140 may be formed of or include an oxide material. In some embodiments, the cover insulating layer 140 may be a multi-layered structure including a plurality of insulating layers.

The bit line contacts 150 may be provided in the cover insulating layer 140. The bit line contact 150 may be connected to the bit line pad 176 of the memory channel structure CS. The bit line contact 150 may include a conductive material.

The bit lines 160 may be provided in the cover insulating layer 140. The bit line 160 may be connected to the bit line contact 150. The bit line 160 may extend in the second direction D2. The bit line 160 may include a conductive material.

Referring to FIG. 2B, the insulating patterns IP may include a first insulating pattern IP1, a second insulating pattern IP2 adjacent to the first insulating pattern IP1, and a third insulating pattern IP3 adjacent to the second insulating pattern IP2.

The conductive patterns CP may include a first conductive pattern CP1 between the first and second insulating patterns IP1 and IP2 and a second conductive pattern CP2 between the second and third insulating patterns IP2 and IP3.

The data storage patterns 174 may include a first data storage pattern DA1 between the first and second insulating patterns IP1 and IP2 and a second data storage pattern DA2 between the second and third insulating patterns IP2 and IP3. The first and second data storage patterns DA1 and DA2 may be adjacent to each other. The first and second data storage patterns DA1 and DA2 may be spaced apart from each other in the third direction D3. The first data storage pattern DA1 may be disposed at the same level in the third direction D3 as the first conductive pattern CP1. The second data storage pattern DA2 may be disposed at the same level in the third direction D3 as the second conductive pattern CP2.

The blocking patterns 175 may include a first blocking pattern BK1 between the first and second insulating patterns IP1 and IP2 and a second blocking pattern BK2 between the second and third insulating patterns IP2 and IP3. The first and second blocking patterns BK1 and BK2 may be adjacent to each other. The first and second blocking patterns BK1 and BK2 may be spaced apart from each other in the third direction D3. The first blocking pattern BK1 may be disposed at the same level in the third direction D3 as the first conductive pattern CP1 and the first data storage pattern DA1. The second blocking pattern BK2 may be disposed at the same level in the third direction D3 as the second conductive pattern CP2 and the second data storage pattern DA2.

The first data storage pattern DA1 may include a first outer portion OU1, which is interposed between the first and second insulating patterns IP1 and IP2, and a first inner portion IN1, which is enclosed by the first outer portion OU1. For example, the first inner portion IN1 may be on the first outer portion OU1. The first outer portion OU1 may be in contact with a top surface of the first insulating pattern IP1 and a bottom surface of the second insulating pattern IP2. The second data storage pattern DA2 may include a second outer portion OU2, which is interposed between the second and third insulating patterns IP2 and IP3, and a second inner portion IN2, which is enclosed by the second outer portion OU2. For example, the second inner portion IN2 may be on the second outer portion OU2. The second outer portion OU2 may be in contact with a top surface of the second insulating pattern IP2 and a bottom surface of the third insulating pattern IP3. The first and second outer portions OU1 and OU2 and the first to third insulating patterns IP1, IP2, and IP3 may overlap with each other in the third direction D3. The first inner portion IN1, the second inner portion IN2, and the tunnel insulating layer 173 may overlap with each other in the third direction D3. As used herein, "an element A overlaps with an element B in a direction X" (or similar language) means that there is at least one line that extends in the direction X and intersects both the elements A and B.

The first and second outer portions OU1 and OU2 and the first and second inner portions IN1 and IN2 may include the same material. As an example, the first and second outer portions OU1 and OU2 and the first and second inner portions IN1 and IN2 may be formed of or include a nitride material.

The largest width W1 of the first outer portion OU1 in the third direction D3 may be smaller than the largest width W2 of the first inner portion IN1 in the third direction D3. A distance between each of the first and second inner portions IN1 and IN2 and the channel layer 172 may be smaller than a distance between each of the first to third insulating patterns IP1, IP2, and IP3 and the channel layer 172. For example, a distance between the first inner portion IN1 and the channel layer 172 and a distance between the second inner portion IN2 and the channel layer 172 may both be smaller than each of a distance between the first insulating pattern IP1 and the channel layer 172, a distance between the second insulating pattern IP2 and the channel layer 172, and a distance between the third insulating pattern IP3 and the channel layer 172. As an example, a distance L1 between the first inner portion IN1 and the channel layer 172 in the first direction D1 may be smaller than a distance L2 between the second insulating pattern IP2 and the channel layer 172 in the first direction D1.

The channel layer 172 may include protruding portions PR. Each of the protruding portions PR may protrude or extend toward a region between the data storage patterns 174. As an example, one of the protruding portions PR of the channel layer 172 may protrude or extend toward a region between the first and second data storage patterns DA1 and DA2.

The channel layer 172 may have a first width W3, when it is measured in the first direction D1 at the same level in the third direction D3 as the first data storage pattern DAL The channel layer 172 may have a second width W4, when it is measured in the first direction D1 at a level in the third direction D3 between the first and second data storage patterns DA1 and DA2. The second width W4 may be a width of the channel layer 172 measured in the first direction D1 at a level in the third direction D3 of the protruding portion PR. The second width W4 of the channel layer 172 may be larger than the first width W3.

The tunnel insulating layer 173 may be provided to cover or be on top and bottom surfaces of the first inner portion IN1 of the first data storage pattern DA1. The tunnel insulating layer 173 may be provided to cover or be on top and bottom surfaces of the second inner portion IN2 of the second data storage pattern DA2.

The first data storage pattern DA1 may include a first surface SU1, which is in contact with the first blocking pattern BK1. The first surface SU1 of the first data storage pattern DA1 may be a surface of the first outer portion OU1. The first surface SU1 of the first data storage pattern DA1 may have a curved shape, when viewed in the sectional view of FIG. 2B. The first data storage pattern DA1 may include a second surface SU2, which is in contact with the tunnel insulating layer 173. The second surface SU2 of the first data storage pattern DA1 may be a surface of the first inner portion IN1. The second surface SU2 of the first data storage pattern DA1 may have a curved shape, when viewed in the sectional view of FIG. 2B.

The first data storage pattern DA1 may include a third surface SU3, which is in contact with the top surface of the first insulating pattern IP1. The third surface SU3 of the first data storage pattern DA1 may be a surface of the first outer portion OU1. The first data storage pattern DA1 may include a fourth surface SU4, which is in contact with the bottom surface of the second insulating pattern IP2. The fourth surface SU4 of the first data storage pattern DA1 may be a surface of the first outer portion OU1. The third and fourth surfaces SU3 and SU4 of the first data storage pattern DA1 may have a flat or linear shape, when viewed in the sectional view of FIG. 2B. A width of the first data storage pattern DA1 in the first direction D1 may be, for example, 60 Angstroms (Å).

A surface of the first blocking pattern BK1 in contact with the first data storage pattern DA1 may have a curved shape, when viewed in the sectional view of FIG. 2B. A surface of the first blocking pattern BK1 in contact with the first conductive pattern CP1 may have a curved shape, when viewed in the sectional view of FIG. 2B.

The data storage patterns 174 may have a structure similar to the first data storage pattern DA1. The blocking patterns 175 may have a structure similar to the first blocking pattern BK1.

In the semiconductor device according to some embodiments of the inventive concept, the data storage patterns 174 may be spaced apart from each other by the tunnel insulating layer 173 and the insulating patterns IP. Thus, it may be possible to prevent electric charges in the data storage pattern 174 from being moved into other elements and thereby to improve a retention property of the semiconductor device.

Figure 3A:
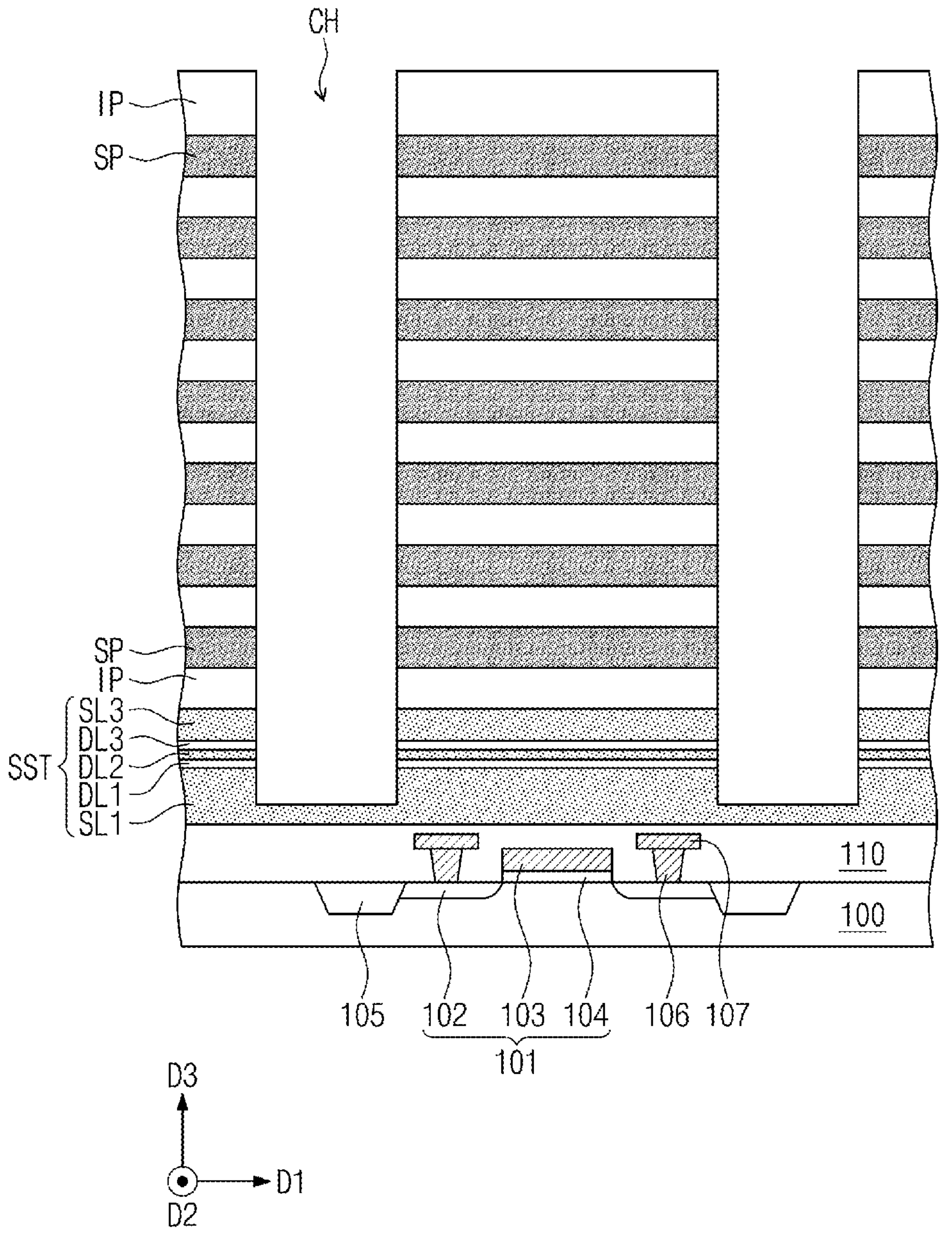
FIGS. 3A, 3B, 4, 5, 6, 7, 8, 9, 10, and 11 are diagrams illustrating a method of fabricating the semiconductor device of FIGS. 2A and 2B.

FIGS. 3A, 3B, 4, 5, 6, 7, 8, 9, 10, and 11 are diagrams illustrating a method of fabricating the semiconductor device of FIGS. 2A and 2B. FIG. 3A may correspond to FIG. 2A. FIGS. 3B, 4, 5, 6, 7, 8, 9, 10 and 11 may correspond to FIG. 2B.

Figure 3B:
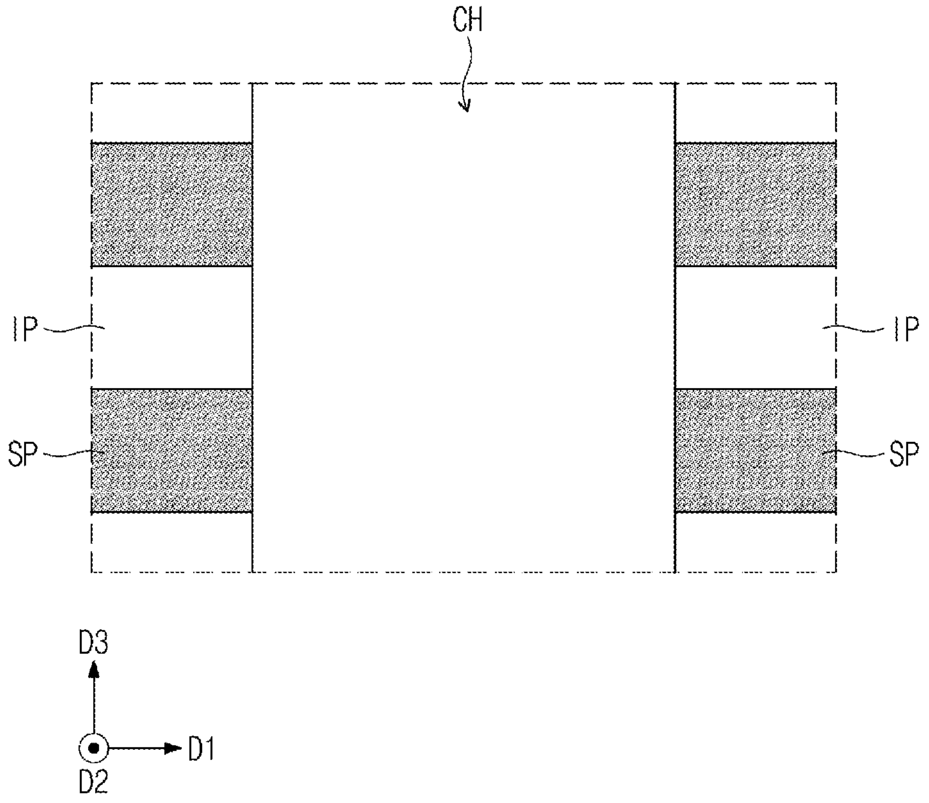

Referring to FIGS. 3A and 3B, the peripheral transistors 101, the device isolation layers 105, the peripheral contacts 106, the peripheral conductive lines 107, and the peripheral circuit insulating layer 110 may be formed on the substrate 100.

The source structure SST may be formed. The formation of the source structure SST may include forming the first source layer SL1, sequentially forming a first dummy layer DL1, a second dummy layer DL2, and a third dummy layer DL3 on the first source layer SL1 in the third direction D3, and forming the third source layer SL3 on the third dummy layer DL3.

Insulating layers and sacrificial layers may be formed to be alternately stacked on top of each other in the third direction D3. The insulating and sacrificial layers may be formed of or include different insulating materials from each other. As an example, the insulating layer may be formed of or include an oxide material, and the sacrificial layer may be formed of or include a nitride material.

Channel holes CH may be formed to extend in the third direction D3 and to penetrate or extend in the insulating and sacrificial layers. The channel hole CH may be formed to penetrate or extend in the third source layer SL3 and the first to third dummy layers DL1, DL2, and DL3.

The insulating layer, in which the channel holes CH are formed, may be defined as an insulating pattern IP. The sacrificial layer, in which the channel holes CH are formed, may be defined as a sacrificial pattern SP. The insulating patterns IP and the sacrificial patterns SP may be alternately stacked on top of each other in the third direction D3. The insulating pattern IP and the sacrificial pattern SP may include insulating materials different from each other. As an example, the insulating pattern IP may be formed of or include an oxide material, and the sacrificial pattern SP may be formed of or include a nitride material.

Figure 4:
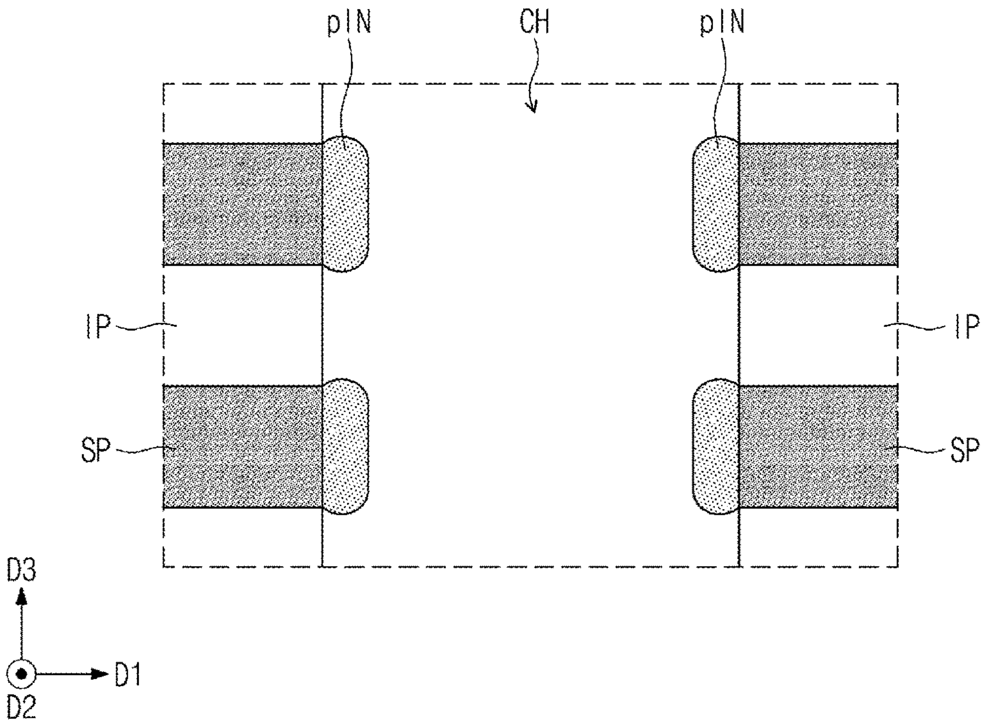

Referring to FIG. 4, preliminary inner patterns pIN may be formed on the sacrificial patterns SP. The preliminary inner pattern pIN may be formed on a side surface of the sacrificial pattern SP. The preliminary inner pattern pIN may be selectively formed on the side surface of the sacrificial pattern SP. The preliminary inner pattern pIN may not be formed on a side surface of the insulating pattern IP. The preliminary inner pattern pIN may include a material, which can be selectively formed on the side surface of the sacrificial pattern SP. As an example, the preliminary inner pattern pIN may be formed of or include polysilicon.

The preliminary inner patterns pIN may be formed in the channel hole CH. The preliminary inner pattern pIN may be enclosed by the sacrificial pattern SP. In some embodiments, the formation of the preliminary inner patterns pIN may include performing a deposition process to form a first preliminary layer on the sacrificial patterns SP and the insulating patterns IP and performing an etching process on the first preliminary layer. A deposition thickness of the first preliminary layer may be larger on the sacrificial pattern SP than on the insulating pattern IP, and a portion of the first preliminary layer deposited on the insulating pattern IP may be removed by the etching process.

Figure 5:
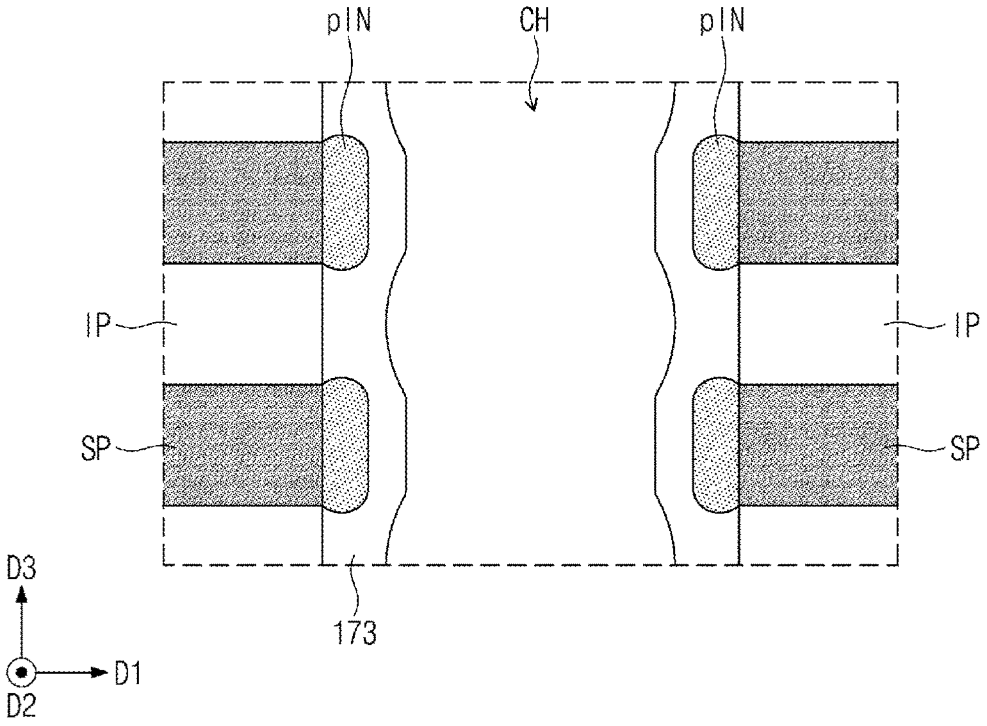

Referring to FIG. 5, the tunnel insulating layer 173 may be formed. The tunnel insulating layer 173 may be formed in the channel hole CH. The tunnel insulating layer 173 may be formed to cover or be on exposed surfaces of the preliminary inner patterns pIN.

Figure 6:
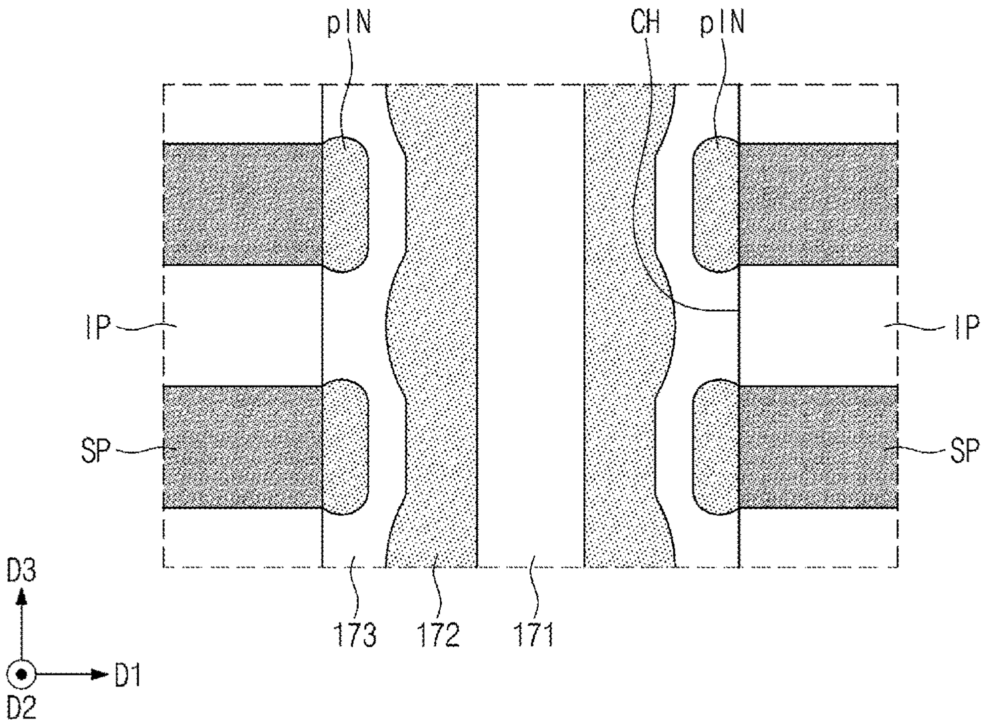

Referring to FIG. 6, the channel layer 172 and the capping layer 171 may be formed. The channel layer 172 and the capping layer 171 may be formed in the channel hole CH. The channel layer 172 and the capping layer 171 may be formed in the tunnel insulating layer 173.

Figure 7:
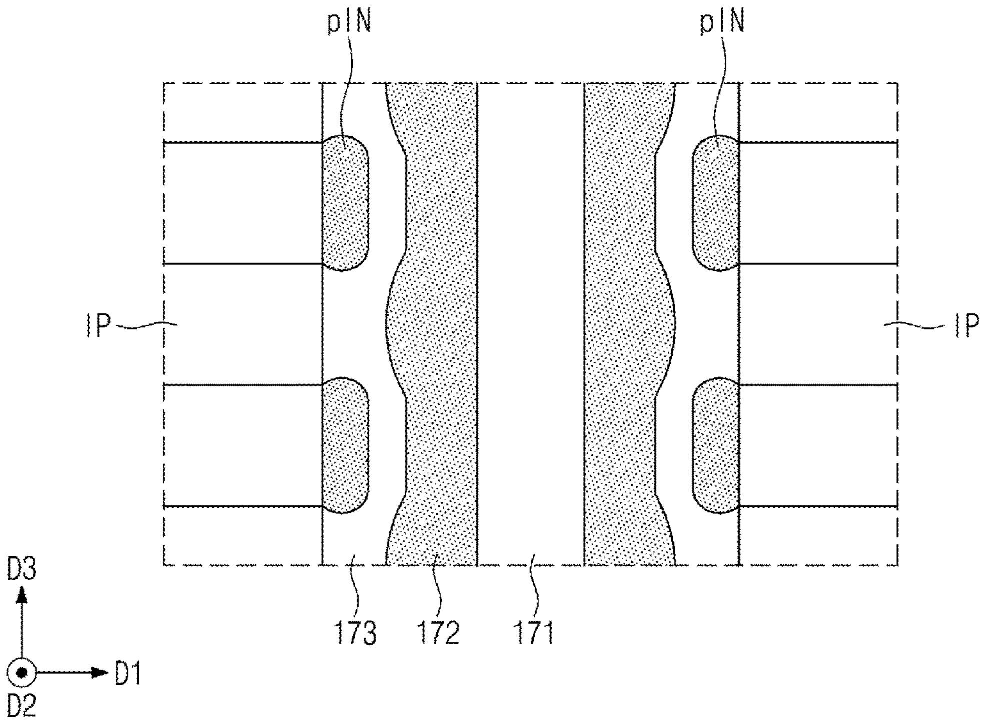

Referring to FIG. 7, the sacrificial patterns SP may be removed. In some embodiments, the sacrificial patterns SP may be removed through a pull-back process.

As a result of the removal of the sacrificial patterns SP, the preliminary inner patterns pIN may be exposed through empty spaces between the insulating patterns IP.

Figure 8:
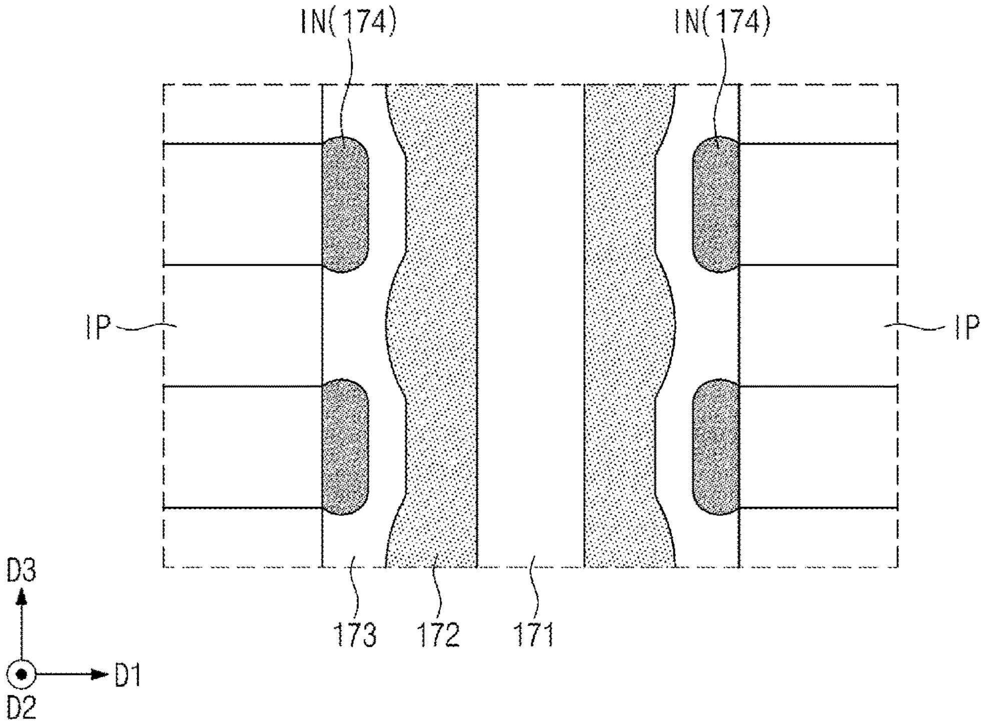

Referring to FIG. 8, the preliminary inner patterns pIN may be nitridated. The nitridated preliminary inner pattern pIN may be defined as an inner portion IN of the data storage pattern 174. The inner portion IN of the data storage pattern 174 may be formed of or include a nitride material.

In some embodiments, the nitridation of the preliminary inner patterns pIN may include providing ammonia gas (NH 3) to the exposed preliminary inner patterns pIN and increasing a process temperature. In some embodiments, the process temperature may be increased to 950° C. or higher.

Figure 9:
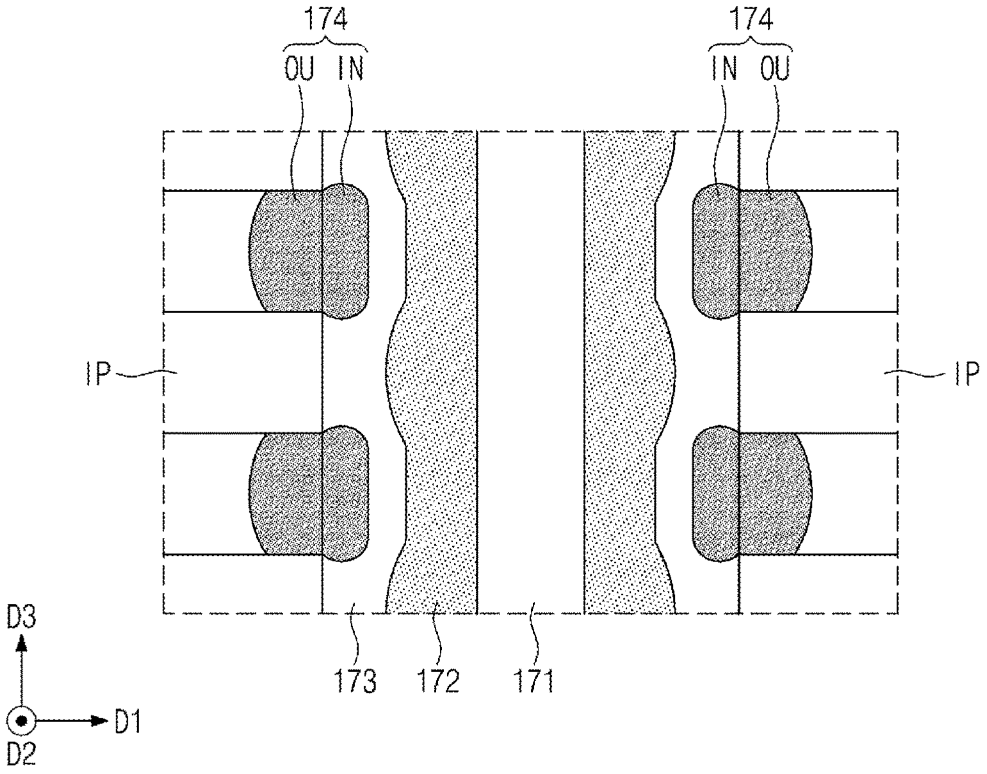

Referring to FIG. 9, outer portions OU of the data storage patterns 174 may be formed. The outer portion OU of the data storage pattern 174 may be selectively formed on the inner portion IN of the data storage pattern 174. The outer portion OU of the data storage pattern 174 may not be formed on top and bottom surfaces of the inner portion IN of the data storage pattern 174.

In some embodiments, the formation of the outer portion OU of the data storage pattern 174 may include performing a deposition process to form a second preliminary layer on the inner portion IN of the data storage pattern 174 and the insulating pattern IP and performing an etching process on the second preliminary layer. A deposition thickness of the second preliminary layer may be large on the inner portion IN of the data storage pattern 174 than on the insulating pattern IP, and a portion of the second preliminary layer deposited on the insulating pattern IP may be removed by the etching process.

Figure 10:
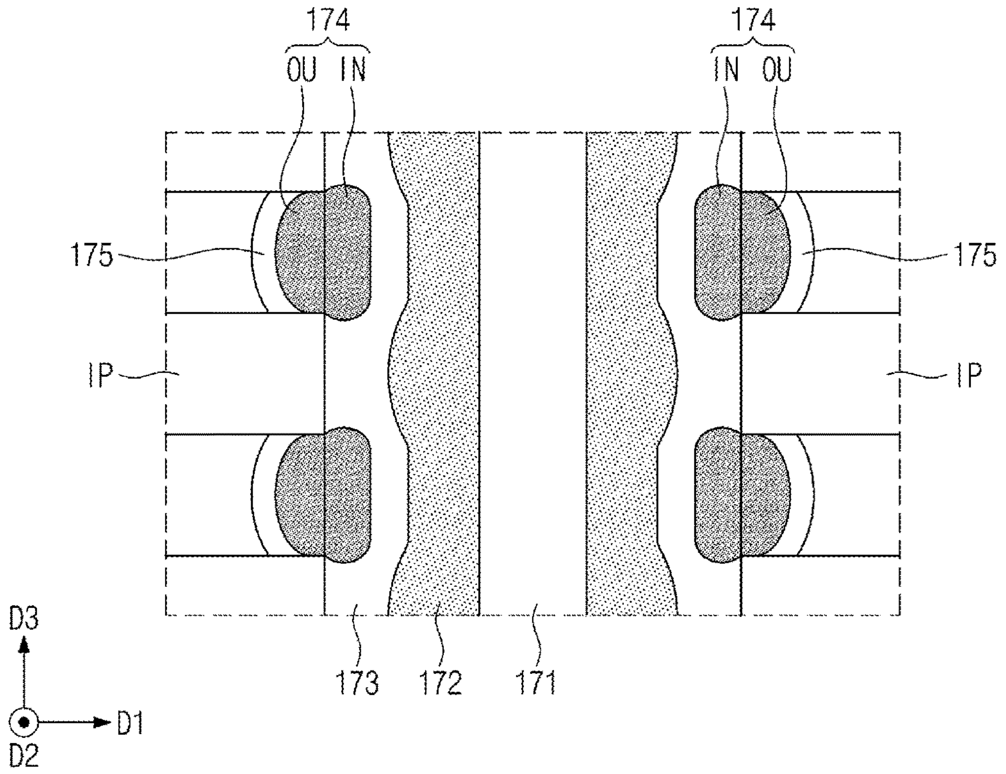

Referring to FIG. 10, the blocking patterns 175 may be formed. The formation of the blocking pattern 175 may include oxidizing a portion of the outer portion OU of the data storage pattern 174. The oxidized portion of the outer portion OU of the data storage pattern 174 may be defined as the blocking pattern 175. As a result of the formation of the blocking pattern 175, a width of the outer portion OU of the data storage pattern 174 in the first direction D1 may be decreased.

Figure 11:
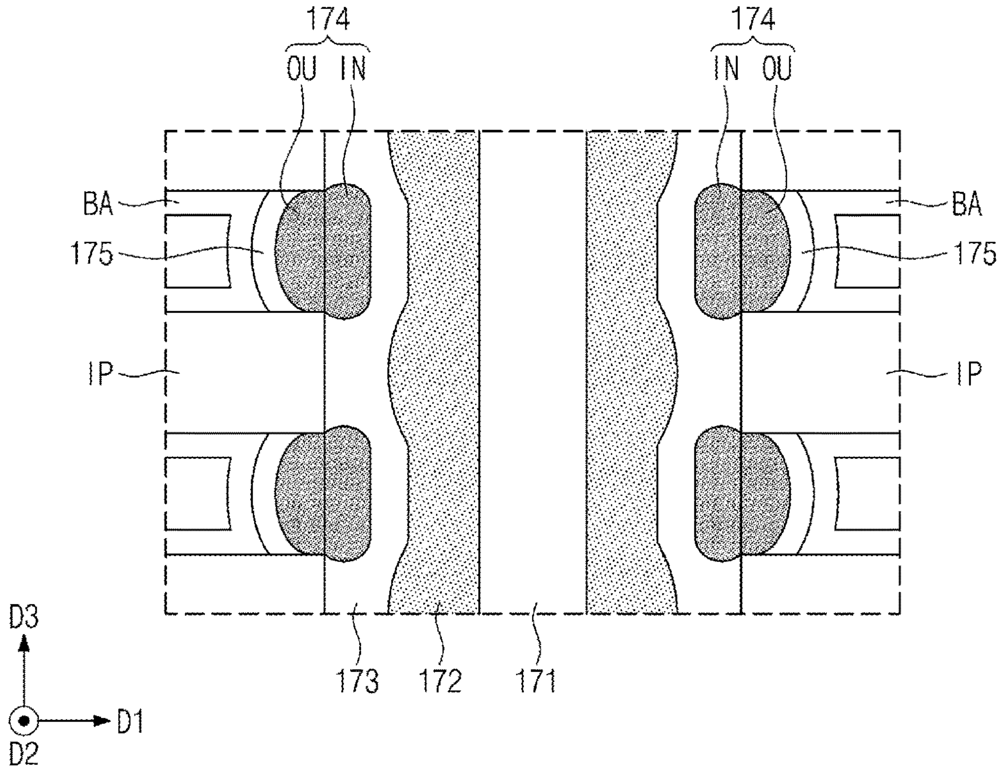

Referring to FIG. 11, the barrier layers BA may be formed. The barrier layer BA may be formed on the insulating pattern IP and the blocking pattern 175.

Referring to FIGS. 2A and 3A, the conductive layers CO may be formed. The first to third dummy layers DL1, DL2, and DL3 may be removed, and then, the second source layer SL2 may be formed. In some embodiments, the process of removing the first to third dummy layers DL1, DL2, and DL3 and forming the second source layer SL2 may be performed before the removal of the sacrificial patterns SP. In some embodiments, the process of removing the first to third dummy layers DL1, DL2, and DL3 and forming the second source layer SL2 may be performed after the formation of the conductive layer CO.

Referring to FIG. 2A, the cover insulating layer 140, the bit line contacts 150, and the bit lines 160 may be formed.

The afore-described fabrication method may include selectively forming the preliminary inner pattern pIN on the sacrificial pattern SP, and in this case, the data storage patterns 174 may be formed to be spaced apart from each other.

Figure 12A:
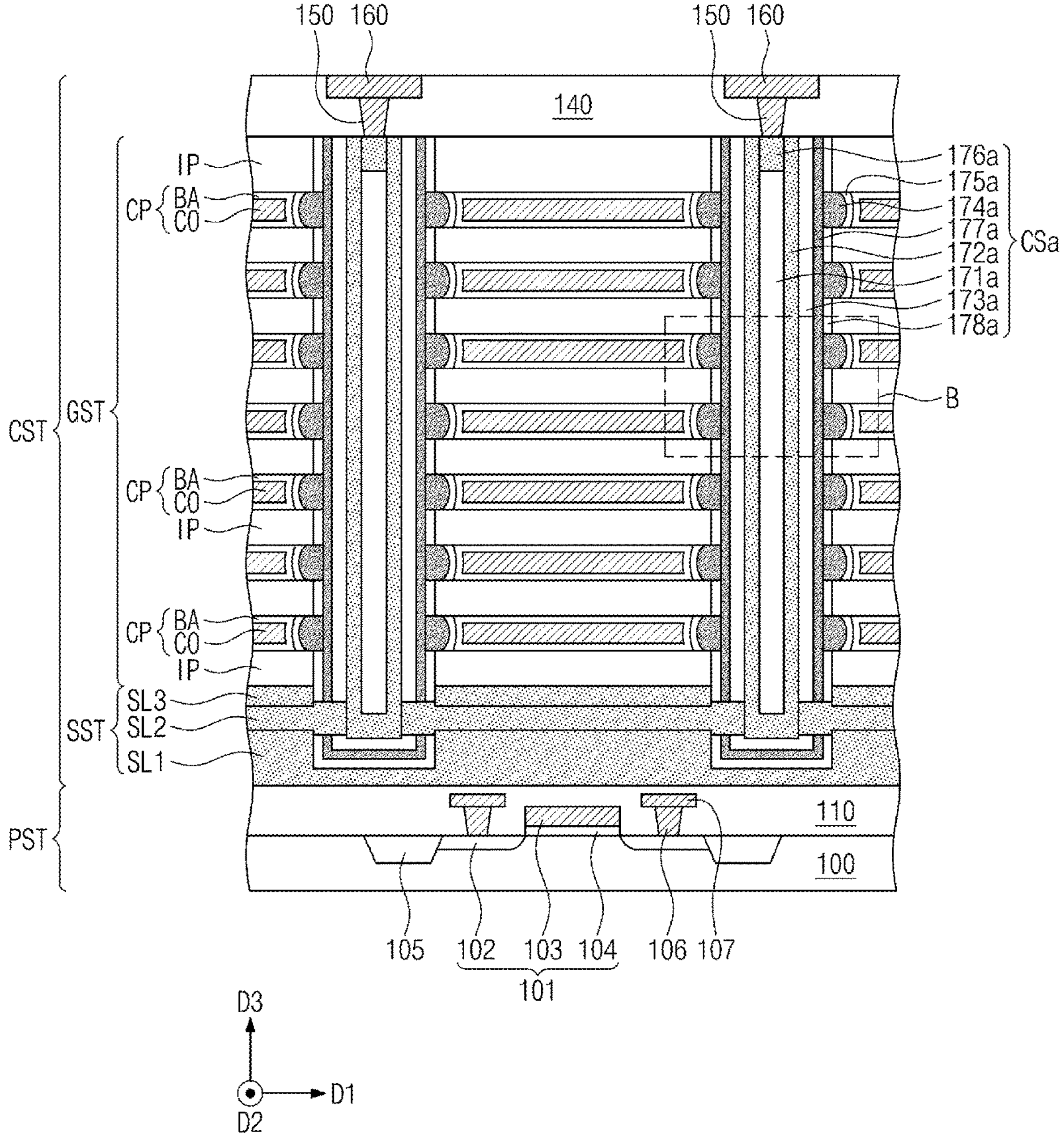
FIG. 12A is a sectional view illustrating a semiconductor device according to some embodiments of the inventive concept.
Figure 12B:
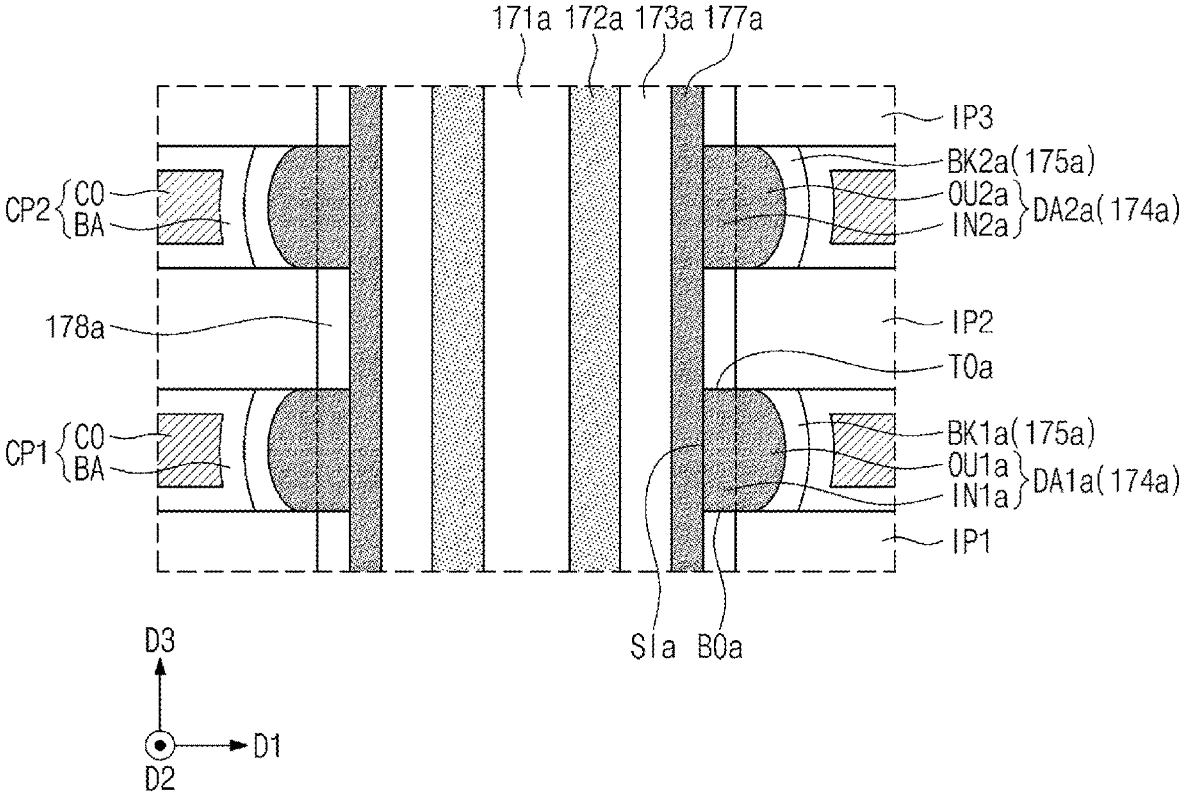
FIG. 12B is an enlarged sectional view illustrating a portion 'B' of FIG. 12A.

FIG. 12A is a sectional view illustrating a semiconductor device according to some embodiments of the inventive concept. FIG. 12B is an enlarged sectional view illustrating a portion 'B' of FIG. 12A.

Referring to FIGS. 12A and 12B, a memory channel structure CSa of the semiconductor device may include a capping layer 171*a*, a channel layer 172*a*, a tunnel insulating layer 173*a*, data storage patterns 174*a*, blocking patterns 175*a*, a bit line pad 176*a*, a seed layer 177*a*, and etch stop patterns 178*a*.

The insulating patterns IP may include the first to third insulating patterns IP1, IP2, and IP3, which are adjacent to each other. The conductive patterns CP may include the first conductive pattern CP1 between the first and second insulating patterns IP1 and IP2 and the second conductive pattern CP2 between the second and third insulating patterns IP2 and IP3.

The data storage patterns 174*a* may include a first data storage pattern DA1*a* between the first and second insulating patterns IP1 and IP2 and a second data storage pattern DA2*a* between the second and third insulating patterns IP2 and IP3.

The blocking patterns 175*a* may include a first blocking pattern BK1*a* between the first and second insulating patterns IP1 and IP2 and a second blocking pattern BK2*a* between the second and third insulating patterns IP2 and IP3.

The first data storage pattern DA1*a* may include a first outer portion OU1*a*, which is interposed between the first and second insulating patterns IP1 and IP2, and a first inner portion IN1*a*, which is enclosed by the first outer portion OU1*a*. For example, the first inner portion IN1*a* may be on the first outer portion OU1*a*. The first outer portion OU1*a* may be in contact with the top surface of the first insulating pattern IP1 and the bottom surface of the second insulating pattern IP2. The second data storage pattern DA2*a* may include a second outer portion OU2*a*, which is interposed between the second and third insulating patterns IP2 and IP3, and a second inner portion IN2*a*, which is enclosed by the second outer portion OU2*a*. For example, the second inner portion IN2*a* may be on the second outer portion OU2*a*. The second outer portion OU2*a* may be in contact with the top surface of the second insulating pattern IP2 and the bottom surface of the third insulating pattern IP3. The first and second outer portions OU1*a* and OU2*a* and the first to third insulating patterns IP1, IP2, and IP3 may overlap with each other in the third direction D3. The first inner portion IN1*a*, the second inner portion IN2*a*, and the etch stop patterns 178*a* may overlap with each other in the third direction D3.

The seed layer 177*a* may be provided to enclose the tunnel insulating layer 173*a*. For example, the seed layer 177*a* may be on the tunnel insulating layer 173*a*. The seed layer 177*a* may be connected to the data storage patterns 174*a*. The data storage patterns 174*a* may be provided to enclose the seed layer 177*a*. For example, the data storage patterns 174*a* may be on the seed layer 177*a*. The seed layer 177*a* may be in contact with the first inner portion IN1*a* of the first data storage pattern DA1*a* and the second inner portion IN2*a* of the second data storage pattern DA2*a*. The seed layer 177*a* may include an insulating material. As an example, the seed layer 177*a* may be formed of or include silicon nitride.

The etch stop patterns 178*a*, which are included in one memory channel structure CSa, may be spaced apart from each other in the third direction D3. The etch stop patterns 178*a* in one memory channel structure CSa may be arranged in the third direction D3. The etch stop pattern 178*a* may be disposed at the same level in the third direction D3 as the insulating pattern IP. The etch stop pattern 178*a* may have a ring shape. The etch stop pattern 178*a* may be interposed between the insulating pattern IP and the seed layer 177*a*. The etch stop pattern 178*a* may be interposed between the inner portions IN1*a* and IN2*a* of the data storage patterns 174*a*. The etch stop pattern 178*a* may be interposed between the first inner portion IN1*a* of the first data storage pattern DA1*a* and the second inner portion IN2*a* of the second data storage pattern DA2*a*. The etch stop pattern 178*a* may include an insulating material. As an example, the etch stop pattern 178*a* may be formed of or include an oxide material.

The first inner portion IN1*a* of the first data storage pattern DA1*a* may include a side surface SIa in contact with the seed layer 177*a*, a bottom surface BOa in contact with the etch stop pattern 178*a*, and a top surface TOa in contact with the etch stop pattern 178*a*. The side surface SIa, the bottom surface BOa, and the top surface TOa of the first inner portion IN1*a* of the first data storage pattern DA1*a* may have a flat or linear shape, when viewed in the sectional view of FIG. 12B.

In the semiconductor device according to some embodiments of the inventive concept, the data storage patterns 174*a* may be spaced apart from each other by the etch stop patterns 178*a* and the insulating patterns IP. Thus, it may be possible to prevent electric charges in the data storage pattern 174*a* from being moved into other elements and thereby to improve the retention property of the semiconductor device.

FIGS. 13, 14, 15, 16, 17, 18, 19 and 20 are diagrams illustrating a method of fabricating the semiconductor device of FIGS. 12A and 12B. FIGS. 13, 14, 15, 16, 17, 18, 19 and 20 may correspond to FIG. 12B.

Figure 13:
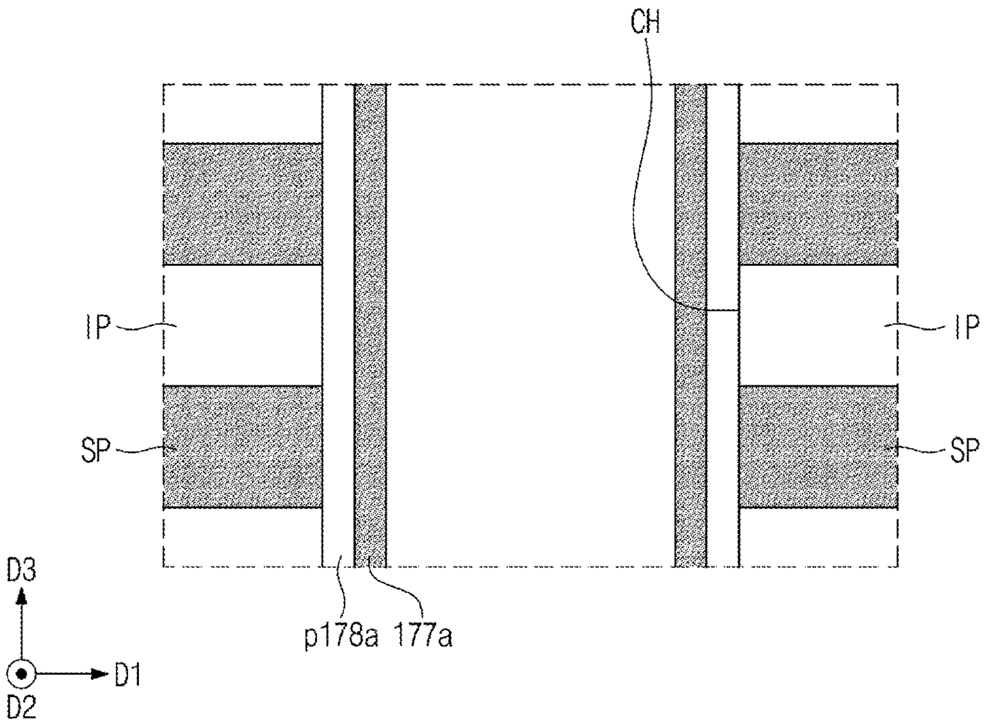
FIGS. 13, 14, 15, 16, 17, 18, 19 and 20 are diagrams illustrating a method of fabricating the semiconductor device of FIGS. 12A and 12B.

Referring to FIG. 13, the insulating patterns IP and the sacrificial patterns SP may be formed. An etch stop layer p178*a* may be formed to cover or be on the side surfaces of the insulating patterns IP and the sacrificial patterns SP exposed by the channel hole CH. The etch stop layer p178*a* may be formed of or include an insulating material. As an example, the etch stop layer p178*a* may be formed of or include an oxide material.

The seed layer 177*a* may be formed in the etch stop layer p178*a*.

Figure 14:
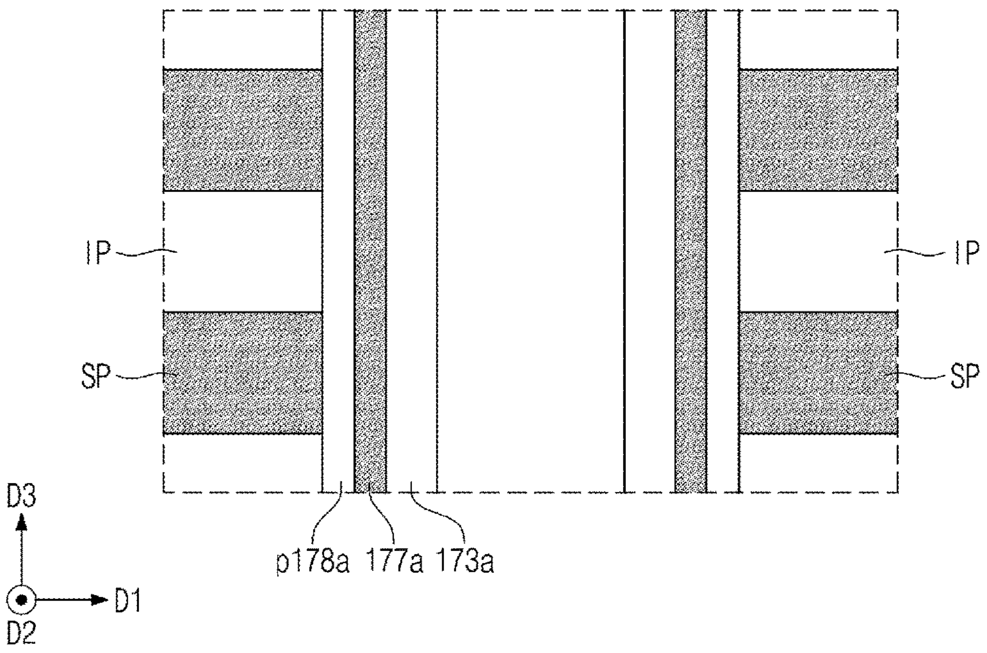

Referring to FIG. 14, the tunnel insulating layer 173*a* may be formed in the seed layer 177*a*.

Figure 15:
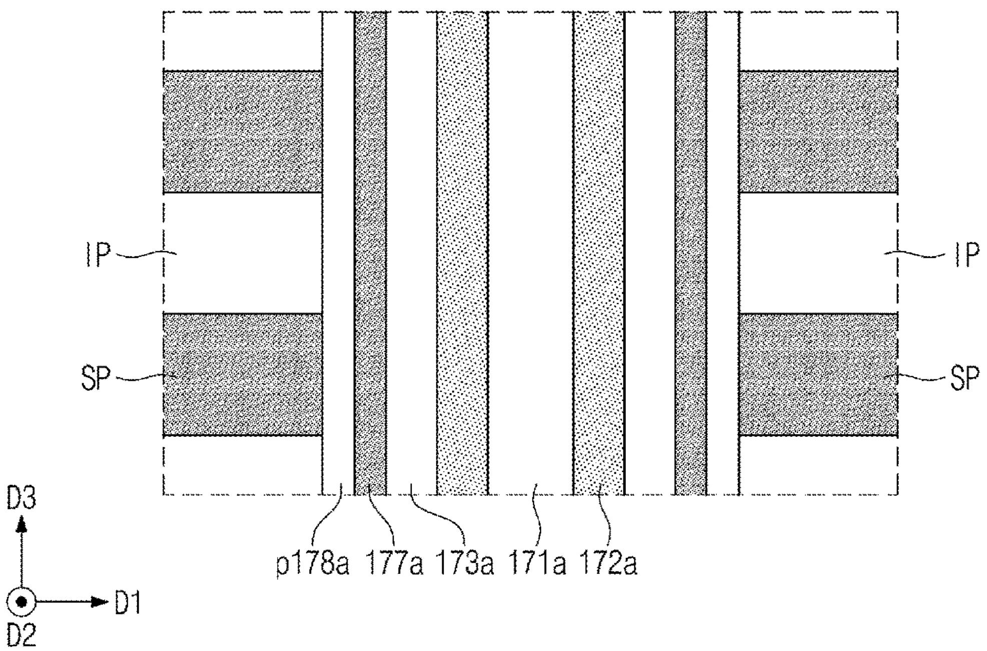

Referring to FIG. 15, the channel layer 172*a* may be formed in the tunnel insulating layer 173*a*. The capping layer 171*a* may be formed in the channel layer 172*a*.

Figure 16:
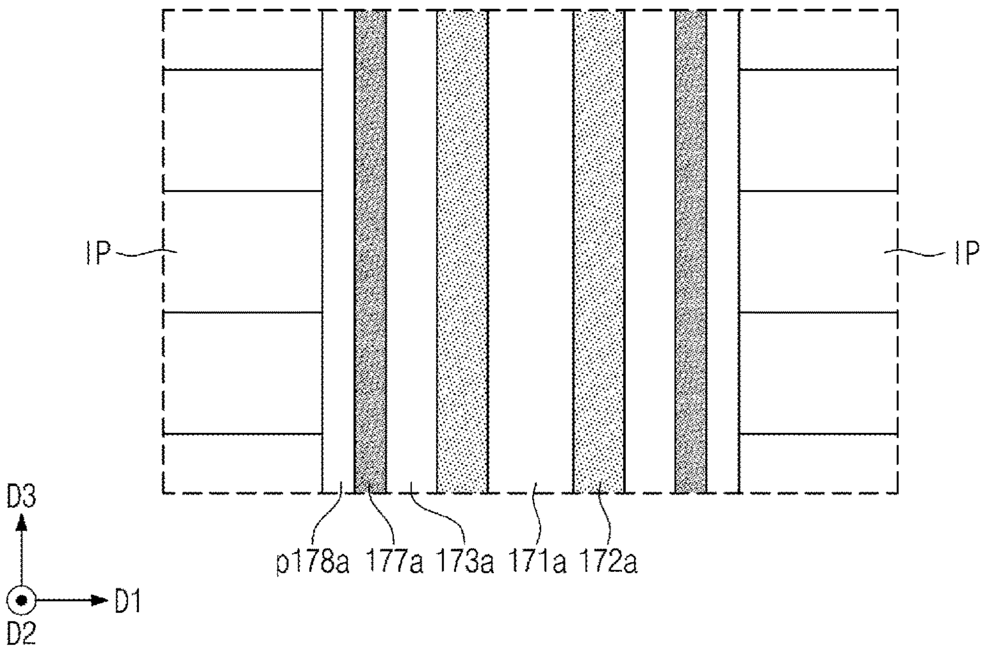

Referring to FIG. 16, the sacrificial patterns SP may be removed. As a result of the removal of the sacrificial patterns SP, the etch stop layer p178*a* may be exposed.

Figure 17:
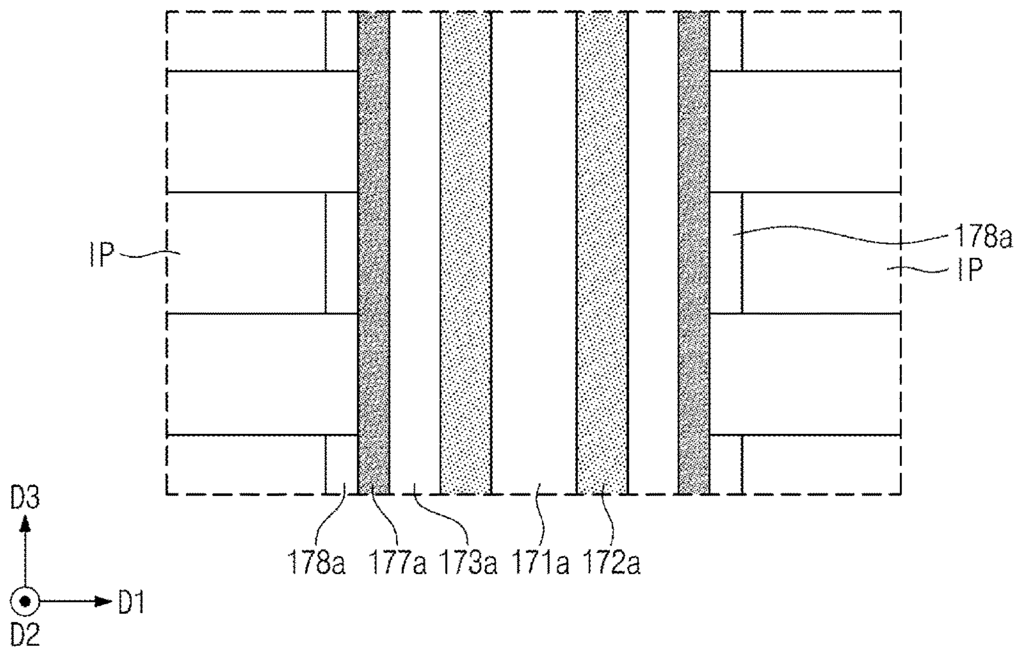

Referring to FIG. 17, the exposed etch stop layer p178*a* may be etched. Accordingly, the etch stop layer p178*a* may be divided into a plurality of etch stop patterns 178*a*. As a result of the etching of the etch stop layer p178*a*, the seed layer 177*a* may be exposed.

Figure 18:
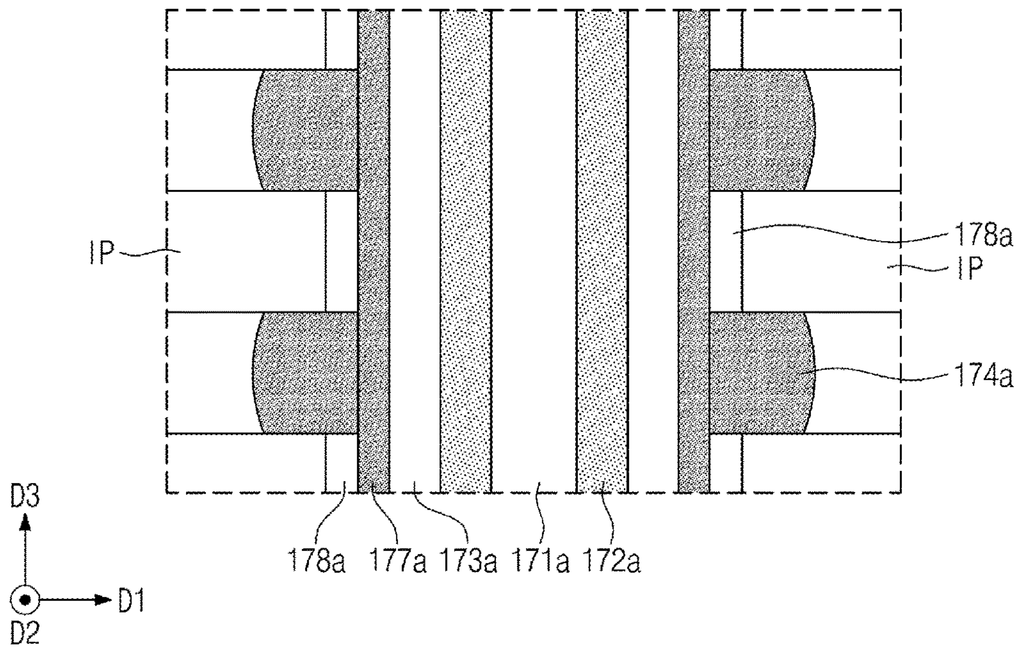

Referring to FIG. 18, the data storage patterns 174*a* may be formed on the seed layer 177*a*. The data storage patterns 174*a* may be selectively formed on the seed layer 177*a*. The data storage patterns 174*a* may not be formed on the insulating patterns IP.

In some embodiments, the formation of the data storage pattern 174*a* may include selectively forming the data storage pattern 174*a* using the seed layer 177*a* as a seed.

Figure 19:
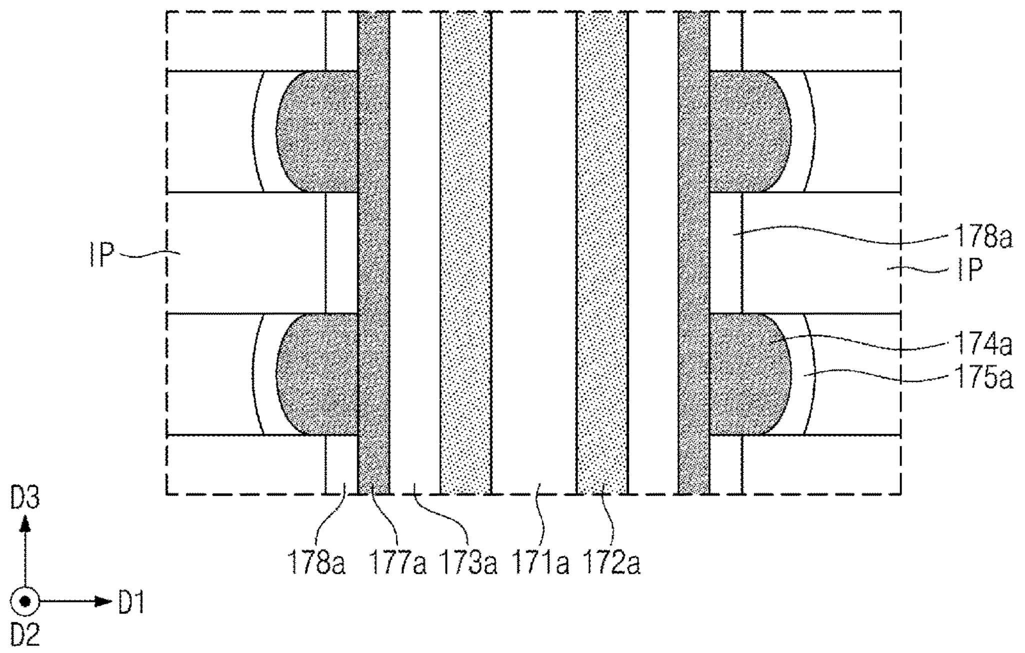

Referring to FIG. 19, the blocking patterns 175*a* may be formed. In some embodiments, the blocking pattern 175*a* may be formed by oxidizing a portion of the data storage pattern 174*a*.

Figure 20:
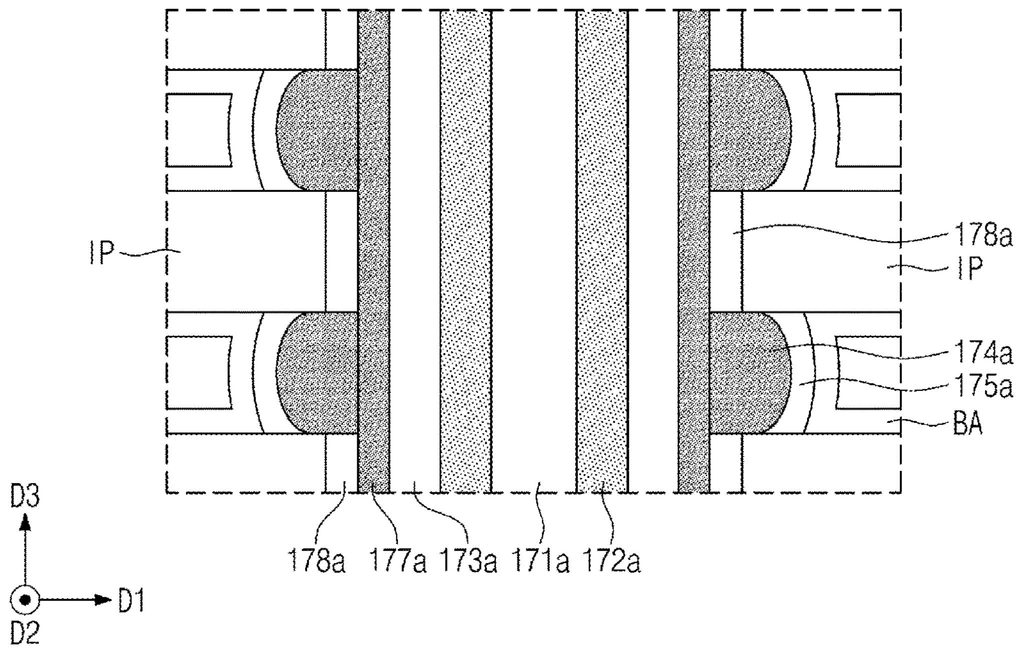

Referring to FIG. 20, the barrier layer BA may be formed.

Referring to FIG. 12B, the conductive layer CO may be formed.

In the fabrication method described above, since the data storage patterns 174*a* are selectively formed on the seed layer 177*a*, the data storage patterns 174*a* may be spaced apart from each other.

Figure 21:
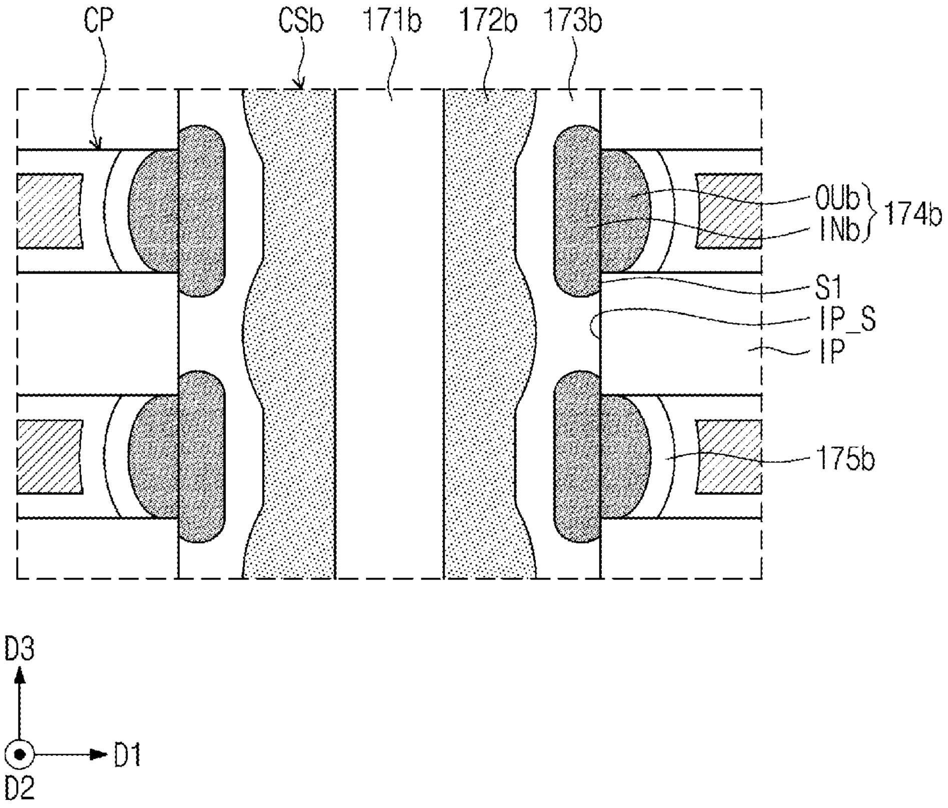
FIG. 21 is an enlarged sectional view illustrating a semiconductor device according to some embodiments of the inventive concept.

FIG. 21 is an enlarged sectional view illustrating a semiconductor device according to some embodiments of the inventive concept.

Referring to FIG. 21, the semiconductor device may include the conductive patterns CP, the insulating patterns IP, and a memory channel structure CSb. The memory channel structure CSb may include a capping layer 171*b*, a channel layer 172*b*, a tunnel insulating layer 173*b*, data storage patterns 174*b*, and blocking patterns 175*b*.

The data storage pattern 174*b* may include an outer portion OUb, which overlaps with the insulating pattern IP in the third direction D3, and an inner portion INb, which overlaps with the tunnel insulating layer 173*b* in the third direction D3. The inner portion INb of the data storage pattern 174*b* may include a surface S1 that is in contact with a side surface IP_S of the insulating pattern IP.

The side surface IP_S of the insulating pattern IP may include a portion, which is in contact with the inner portion INb of the data storage pattern 174*b*, and another portion, which is in contact with the tunnel insulating layer 173*b*.

Figure 22:
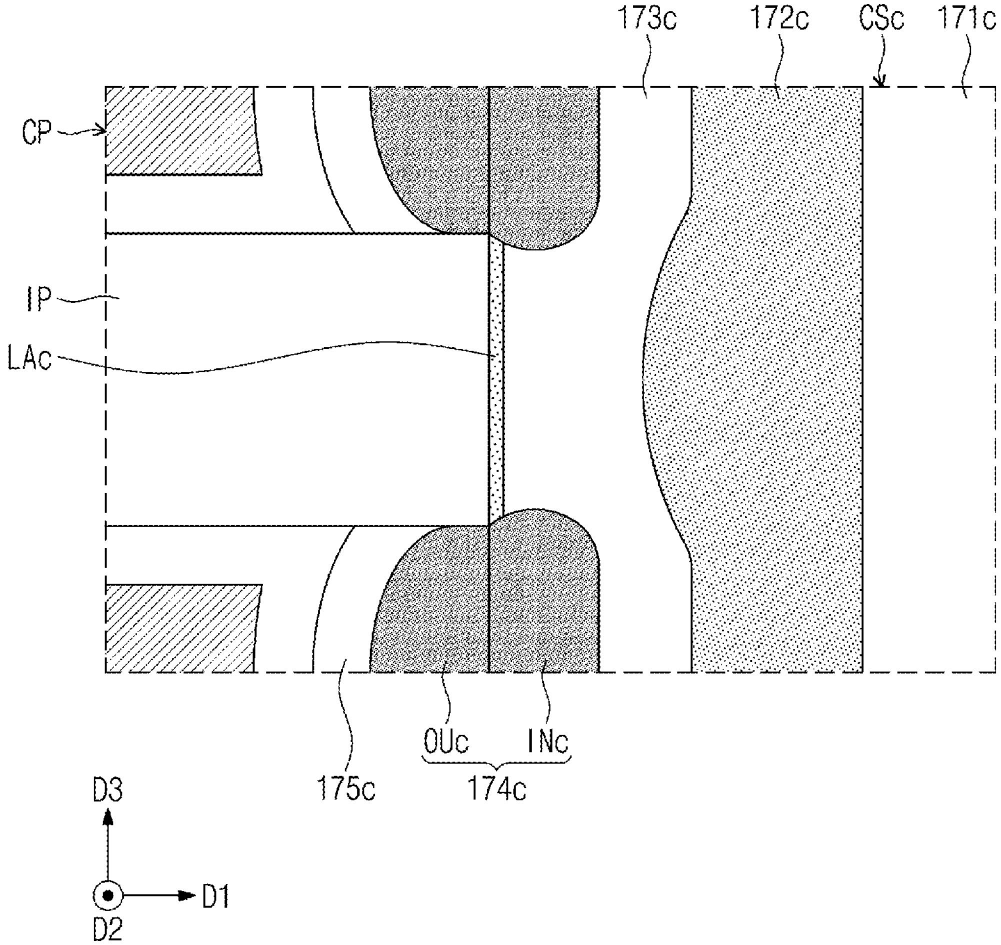
FIG. 22 is an enlarged sectional view illustrating a semiconductor device according to some embodiments of the inventive concept.

FIG. 22 is an enlarged sectional view illustrating a semiconductor device according to some embodiments of the inventive concept.

Referring to FIG. 22, the semiconductor device may include the conductive patterns CP, the insulating patterns IP, and a memory channel structure CSc. The memory channel structure CSc may include a capping layer 171*c*, a channel layer 172*c*, a tunnel insulating layer 173*c*, data storage patterns 174*c*, and blocking patterns 175*c*. The data storage pattern 174*c* may include an outer portion OUc and an inner portion INc.

The semiconductor device may further include a deposition stop layer LAc. The deposition stop layer LAc may be provided to enclose the tunnel insulating layer 173*c*. For example, the deposition stop layer LAc may be on the tunnel insulating layer 173*c*. The deposition stop layer LAc may be interposed between the tunnel insulating layer 173*c* and the insulating pattern IP. The deposition stop layer LAc may be interposed between the inner portions INc of the data storage patterns 174*c*. The deposition stop layer LAc may be in contact with a side surface of the insulating pattern IP and a side surface of the tunnel insulating layer 173*c*.

The deposition stop layer LAc may include a material capable of prohibiting a polysilicon deposition process. As an example, the deposition stop layer LAc may be a monolayer of fluorine.

In some embodiments, the formation of the inner portion INc of the data storage pattern 174*c* may include selectively forming the deposition stop layer LAc on the insulating pattern IP, before forming the preliminary inner pattern on the sacrificial pattern, and selectively depositing the preliminary inner pattern on the sacrificial pattern, on which the deposition stop layer LAc is not formed.

Figure 23:
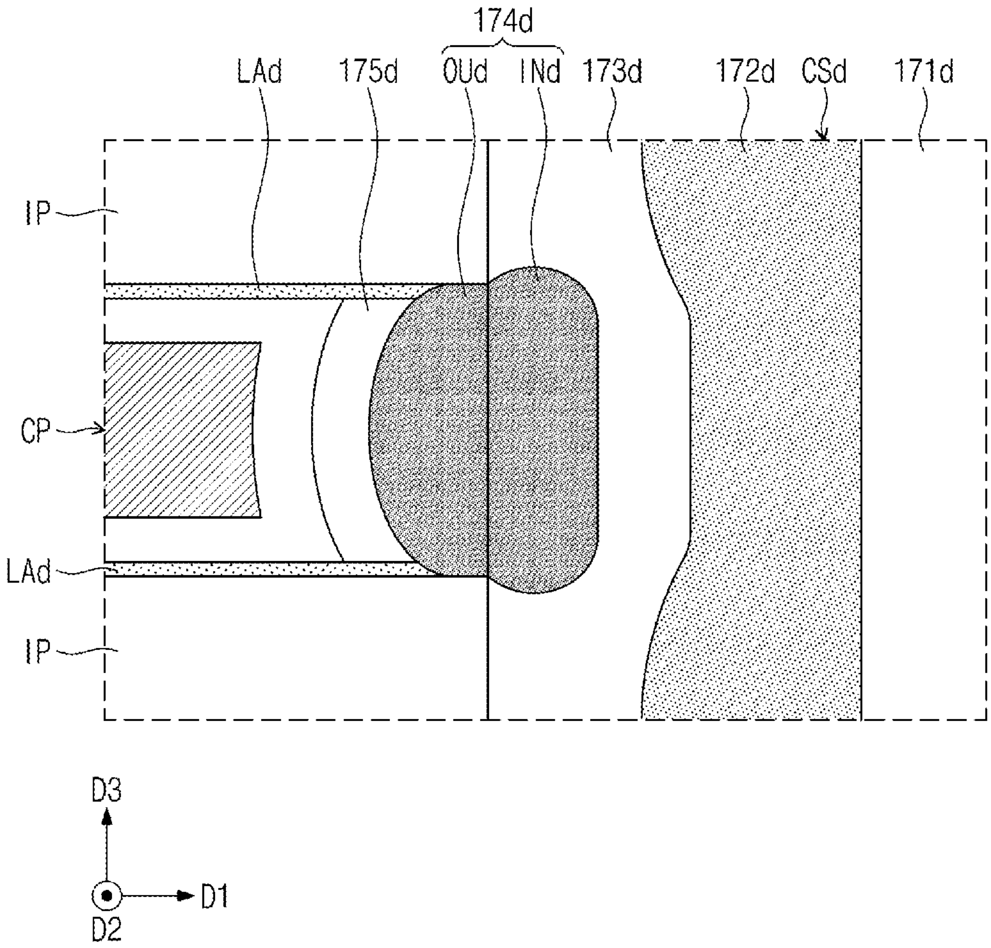
FIG. 23 is an enlarged sectional view illustrating a semiconductor device according to some embodiments of the inventive concept.

FIG. 23 is an enlarged sectional view illustrating a semiconductor device according to some embodiments of the inventive concept.

Referring to FIG. 23, the semiconductor device may include the conductive patterns CP, the insulating patterns IP, and a memory channel structure CSd. The memory channel structure CSd may include a capping layer 171*d*, a channel layer 172*d*, a tunnel insulating layer 173*d*, data storage patterns 174*d*, and blocking patterns 175*d*. The data storage pattern 174*d* may include an outer portion OUd and an inner portion INd.

The semiconductor device may further include deposition stop layers LAd. The deposition stop layer LAd may be interposed between the insulating pattern IP and the conductive pattern CP. The deposition stop layer LAd may be interposed between the blocking pattern 175*d* and the insulating pattern IP. The conductive pattern CP may be interposed between the deposition stop layers LAd. The blocking pattern 175*d* may be interposed between the deposition stop layers LAd. The deposition stop layer LAd may be in contact with both top and bottom surfaces of the blocking pattern 175*d*.

The deposition stop layer LAd may include a material capable of prohibiting a nitride deposition process. As an example, the deposition stop layer LAd may be a monolayer of fluorine.

In some embodiments, the formation of the outer portion OUd of the data storage pattern 174*d* may include removing the sacrificial patterns to expose top and bottom surfaces of the insulating patterns IP, selectively forming the deposition stop layers LAd on the exposed top and bottom surfaces of the insulating patterns IP, and selectively depositing the outer portion OUd on the inner portion INd, on which the deposition stop layer LAd is not formed.

In semiconductor devices according to example embodiments of the inventive concept and electronic systems including the same, the data storage patterns may be provided to be spaced apart from each other, and thus, it may be possible to prevent electric charges in the data storage pattern from being moved to other memory cells, and thereby to improve a retention property of the semiconductor device.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

While example embodiments of the inventive concept have been particularly shown and described, it will be understood by one of ordinary skill in the art that variations in form and detail may be made therein without departing from the scope of the attached claims.

What is claimed is:

1. A semiconductor device, comprising:

a gate stack that includes a first insulating pattern, a second insulating pattern adjacent to the first insulating pattern, a third insulating pattern adjacent to the second insulating pattern, a first conductive pattern between the first and second insulating patterns, and a second conductive pattern between the second and third insulating patterns;

a channel layer that extends in the gate stack;

a tunnel insulating layer on the channel layer; and a first data storage pattern and a second data storage pattern on the tunnel insulating layer, wherein the first data storage pattern comprises a first outer portion between the first and second insulating patterns, and a first inner portion on the first outer portion, wherein the second data storage pattern comprises a second outer portion between the second and third insulating patterns, and a second inner portion on the second outer portion, wherein a distance between each of the first and second inner portions and the channel layer is smaller than a distance between each of the first to third insulating patterns and the channel layer, wherein the first to third insulating patterns are arranged in a first direction, and wherein a largest width of the first outer portion in the first direction is smaller than a largest width of the first inner portion in the first direction.

2. The semiconductor device of claim 1, wherein the first and second inner portions and the first and second outer portions comprise a nitride material.

3. The semiconductor device of claim 1, wherein the first data storage pattern and the second data storage pattern are spaced apart from each other.

4. The semiconductor device of claim 1, wherein the channel layer comprises a protruding portion that extends toward a region between the first data storage pattern and the second data storage pattern.

5. The semiconductor device of claim 1, wherein the channel layer has a first width in a first direction at a same level in a second direction as the first data storage pattern, the first and second directions being orthogonal to each other, wherein the channel layer has a second width in the first direction at a level in the second direction between the first and second data storage patterns, and wherein the second width is larger than the first width.

6. The semiconductor device of claim 1, wherein the tunnel insulating layer is on top and bottom surfaces of the first inner portion and top and bottom surfaces of the second inner portion.

7. The semiconductor device of claim 1, further comprising an etch stop pattern between the first inner portion and the second inner portion.

8. The semiconductor device of claim 1, further comprising a seed layer in contact with the first inner portion and the second inner portion.

9. A semiconductor device, comprising:

a gate stack that includes an insulating pattern and a conductive pattern alternately stacked on top of each other;

a channel layer that extends in the gate stack;

a tunnel insulating layer on the channel layer;

a data storage pattern on the tunnel insulating layer; and a blocking pattern on the data storage pattern, wherein the data storage pattern comprises a first surface in contact with the blocking pattern and a second surface in contact with the insulating pattern, wherein the first surface of the data storage pattern has a curved shape, wherein the second surface of the data storage pattern has a flat shape, wherein the data storage pattern comprises an outer portion in contact with a top surface of the insulating pattern, and an inner portion in contact with a side surface of the insulating pattern.

10. The semiconductor device of claim 9, wherein the data storage pattern comprises a third surface that is in contact with the tunnel insulating layer and has a curved shape.

11. The semiconductor device of claim 9, further comprising a deposition stop layer between the insulating pattern and the tunnel insulating layer.

12. The semiconductor device of claim 11, wherein the deposition stop layer comprises fluorine.

13. The semiconductor device of claim 9, further comprising a deposition stop layer between the insulating pattern and the conductive pattern.

14. The semiconductor device of claim 9, further comprising a seed layer between the tunnel insulating layer and the data storage pattern, wherein the data storage pattern has a side surface that is in contact with the seed layer and has a flat shape.

15. The semiconductor device of claim 14, further comprising an etch stop pattern between the seed layer and the insulating pattern.

16. The semiconductor device of claim 15, wherein the data storage pattern comprises an inner portion in contact with the etch stop pattern, and an outer portion in contact with the insulating pattern.

17. An electronic system, comprising:

a main substrate;

a semiconductor device on the main substrate; and a controller on the main substrate and electrically connected to the semiconductor device, wherein the semiconductor device comprises:

a gate stack that includes an insulating pattern and a conductive pattern alternately stacked on top of each other;

a channel layer that extends in the gate stack;

a tunnel insulating layer on the channel layer;

data storage patterns on the tunnel insulating layer; and blocking patterns on the data storage patterns, respectively, wherein the data storage patterns are spaced apart from each other, wherein each of the data storage patterns comprises an outer portion in contact with a top surface of the insulating pattern, and an inner portion on the outer portion, wherein a distance between the inner portion and the channel layer is smaller than a distance between the insulating pattern and the channel layer, wherein the inner portion and the outer portion comprise a nitride material, wherein the tunnel insulating layer is on a top and a bottom surface of the inner portion.

18. The electronic system of claim 17, wherein the insulating pattern and the conductive pattern are alternately stacked on top of each other in a first direction, and wherein a largest width of a first outer portion between the insulating pattern and a second insulating pattern in the first direction is smaller than a largest width of a first inner portion in the first direction, the first inner portion on the first outer portion.

19. The electronic system of claim 17, wherein the outer portion is in contact with top surfaces of the insulating pattern, respectively, and the inner portion is in contact with a side surface of the insulating pattern, respectively.

20. The electronic system of claim 17, wherein the outer portion overlaps with the insulating pattern, and wherein the inner portion overlaps with the tunnel insulating layer.

* * * * *